(12) United States Patent
Petta et al.

(10) Patent No.: US 10,978,578 B2
(45) Date of Patent: Apr. 13, 2021

(54) SEMICONDUCTOR QUANTUM DOT DEVICE AND METHOD FOR FORMING A SCALABLE LINEAR ARRAY OF QUANTUM DOTS

(71) Applicant: The Trustees of Princeton University, Princeton, NJ (US)

(72) Inventors: Jason Petta, Princeton, NJ (US); David Zajac, Gibsonia, PA (US); Thomas Hazard, Agoura Hills, CA (US)

(73) Assignee: The Trustees of Princeton University, Princeton, NJ (US)

( * ) Notice: Subject to any disclaimer, the term of this patent is extended or adjusted under 35 U.S.C. 154(b) by 59 days.

(21) Appl. No.: 16/222,529

(22) Filed: Dec. 17, 2018

(65) Prior Publication Data

US 2020/0027972 A1    Jan. 23, 2020

Related U.S. Application Data

(62) Division of application No. 15/208,227, filed on Jul. 12, 2016, now Pat. No. 10,192,976.
(Continued)

(51) Int. Cl.
*H01L 29/66* (2006.01)
*H01L 31/0352* (2006.01)
(Continued)

(52) U.S. Cl.
CPC .... *H01L 29/66977* (2013.01); *H01L 29/0692* (2013.01); *H01L 29/423* (2013.01); *H01L 29/7613* (2013.01); *H01L 31/035209* (2013.01); *H01L 31/035218* (2013.01); *H01L 31/035236* (2013.01); *H01L 29/165* (2013.01); *H01L 29/7782* (2013.01); *Y02E 10/50* (2013.01)

(58) Field of Classification Search
CPC ....... H01L 29/66977; H01L 31/035218; H01L 31/035209; H01L 31/035236; H01L 29/0692; H01L 29/7613; H01L 29/423; H01L 29/7782; H01L 29/165; Y02E 10/50
See application file for complete search history.

(56) References Cited

U.S. PATENT DOCUMENTS 6,573,527 B1    6/2003  Sugiyama et al.
2003/0006471 A1  1/2003  Satoh et al.
(Continued)

OTHER PUBLICATIONS

M Ciorga et al., Tunable Negative Differential Resistance controlled by Spin Blockade in Single Electron Transistors, Appl. Phys. Lett. 80, 2177 (2002) [Cited in related U.S. Appl. No. 15/208,227].
(Continued)

*Primary Examiner* — Thanhha S Pham
(74) *Attorney, Agent, or Firm* — BakerHostetler

(57) ABSTRACT

Scalable quantum dot devices and methods are described. An example quantum dot device may comprise one or more repeated cells of a repeating quantum dot structure. The repeated cells may be arranged as a linear array of quantum dots. A single repeated cell may comprise a plurality of quantum dots. The repeated cells may be configured to cause movement of a single electron between adjacent quantum dots. A repeated cell may also comprise a charge sensor for readout of the plurality of quantum dots.

33 Claims, 13 Drawing Sheets

Related U.S. Application Data

(60) Provisional application No. 62/328,691, filed on Apr. 28, 2016.

(51) Int. Cl.
    *H01L 29/423*     (2006.01)
    *H01L 29/76*     (2006.01)
    *H01L 29/06*     (2006.01)
    *H01L 29/165*     (2006.01)
    *H01L 29/778*     (2006.01)

(56) References Cited

U.S. PATENT DOCUMENTS

| | | | |
|---|---|---|---|
| 2003/0052317 A1* | 3/2003 | Ohshima | H01L 29/7613 257/14 |
| 2003/0153151 A1 | 8/2003 | Choi et al. | |
| 2003/0153152 A1 | 8/2003 | Klinger et al. | |
| 2008/0054249 A1 | 3/2008 | Xie | |
| 2008/0067497 A1 | 3/2008 | Kim | |
| 2011/0084284 A1 | 4/2011 | Zhang et al. | |
| 2014/0007930 A1 | 1/2014 | Kim et al. | |

OTHER PUBLICATIONS

J. R. Petta et al., Coherent Manipulation of Coupled Electron Spins in Semiconductor Quantum Dots, Science 309, 2180 (2005) [Cited in related U.S. Appl. No. 15/208,227].
M. Stopa and C. M. Marcus, Magnetic Field Control of Exchange and Noise Immunity in Double Quant um Dots, Nano Lett. 8, 1778 (2008) [Cited in related U.S. Appl. No. 15/208,227].
E. A. Laird et al., Coherent spin manipulation in an exchange-only qubit, Phys. Rev. B 82, 075403 (2010) [Cited in related U.S. Appl. No. 15/208,227].
G. E. Moore, Cramming more components onto integrated circuits, Electronics 38, 8 (1965) [Cited in related U.S. Appl. No. 15/208,227].
P. W. Shor, Polynomial-time algorithms for prime factorization and discrete logarithms on a quantum computer, SIAM Review 41, 303 (1999) [Cited in related U.S. Appl. No. 15/208,227].
L. K. Grover, A fast quantum mechanical algorithm for database search, In Proc of the 28th Ann ACM Symposium on Theory of Computing (ACM, 1996) pp. 212-219 [Cited in related U.S. Appl. No. 15/208,227].
L. P. Kouwenhoven et al., Electron Transport in Quantum Dots, Mesoscopic electron transport (Springer, 1997) [Cited in related U.S. Appl. No. 15/208,227].
R. Hansonet al., Spins in few-electron quantum dots, Rev. Mod. Phys. 79, 1217 (2007) [Cited in related U.S. Appl. No. 15/208,227].
D. Loss and D. P. DiVincenzo, Quantum computation with quantum dots, Phys. Rev. A 57, 120 (1998) [Cited in related U.S. Appl. No. 15/208,227].
D. P. DiVincenzo et al., Universal quantum computation with the exchange interaction, Nature (London) 408, 339 (2000) [Cited in related U.S. Appl. No. 15/208,227].
J. M. Taylor et al., Fault-tolerant architecture for quantum computation using electrically controlled semiconductor spins, Nat. Phys. 1, 177 (2005) [Cited in related U.S. Appl. No. 15/208,227].
M. Steger et al., Quantum Information Storage for Over 180 s Using Donor Spins in a 28Si "Semiconductor Vacuum," Science 336, 1280 (2012) [Cited in related U.S. Appl. No. 15/208,227].
A. M. Tyryshkin et al., Electron spin coherence exceeding seconds in high-purity silicon, Nat. Mater. 11, 143 (2012) [Cited in related U.S. Appl. No. 15/208,227].
C. Payette et al., Single charge sensing and transport in double quantum dots fabricated from commercially grown Si/SiGe heterostructures, Appl. Phys. Lett. 100, 043508 (2012) [Cited in related U.S. Appl. No. 15/208,227].
D. M. Zajac et al., A reconfigurable gate architecture for Si/SiGe quantum dots, Appl. Phys. Lett. 106, 223507 (2015) [Cited in related U.S. Appl. No. 15/208,227].
X. Mi et al., Magnetotransport studies of mobility limiting mechanisms in undoped Si/SiGe heterostructures, Phys. Rev. B 92, 035304 (2015) [Cited in related U.S. Appl. No. 15/208,227].
C. H. Yang et al., Spin-valley lifetimes in a silicon quantum dot with tunable valley splitting, Nat. Commun. 4, 2069 (2013) [Cited in related U.S. Appl. No. 15/208,227].
M. G. Borselli et al., Measurement of valley splitting in high-symmetry Si/SiGe quantum dots, Appl. Phys. Lett. 98, 123118 (2011) [Cited in related U.S. Appl. No. 15/208,227].
J. M. Elzerman et al., Excited-state spectroscopy on a nearly closed quantum dot via charge detection, Appl. Phys. Lett. 84, 4617 (2004) [Cited in related U.S. Appl. No. 15/208,227].
C. H. Yang et al, Orbital and valley state spectra of a few-electron silicon quantum dot, Phys. Rev. B 86, 115319 (2012) [Cited in related U.S. Appl. No. 15/208,227].
M. Yuan et al., Si/SiGe quantum dot with superconducting single-electron transistor charge sensor, Appl. Phys. Lett. 98, 142104 (2011) [Cited in related U.S. Appl. No. 15/208,227].
J. M. Elzerman et al., Single-shot read-out of an individual electron spin in a quantum dot, Nature (London) 430, 431 (2004) [Cited in related U.S. Appl. No. 15/208,227].
A. Morello et al., Single-shot readout of an electron spin in silicon, Nature (London) 467, 687 (2010) [Cited in related U.S. Appl. No. 15/208,227].
J. Medford et al., Quantum-dot-based resonant exchange qubit, Phys. Rev. Lett. 111, 050501 (2013) [Cited in related U.S. Appl. No. 15/208,227].
FastCap (http://www.fastfieldsolvers.com/) (2015) [Cited in related U.S. Appl. No. 15/208,227].
W. G. Van der Wiel et al., Electron transport through double quantum dots, Rev. Mod. Phys. 75, 1 (2002) [Cited in related U.S. Appl. No. 15/208,227].
B. Kung et al., Irreversibility on the level of single-electron tunneling, Phys. Rev. X 2, 011001 (2012) [Cited in related U.S. Appl. No. 15/208,227].
V. F. Maisi et al., Spin-Orbit Coupling at the Level of a Single Electron, Phys. Rev. Lett. 116, 136803 (2016) [Cited in related U.S. Appl. No. 15/208,227].
L. M. K. Vandersypen et al., Real-time detection of single-electron tunneling using a quantum point contact, Appl. Phys. Lett. 85, 4394 (2004) [Cited in related U.S. Appl. No. 15/208,227].
S. Gustavsson et al., Electron counting in quantum dots, Surf. Sci. Rep. 64, 191 (2009) [Cited in related U.S. Appl. No. 15/208,227].
D. J. Reilly et al., Fast single-charge sensing with a rf quantum point contact, Appl. Phys. Lett. 91, 162101 (2007) [Cited in related U.S. Appl. No. 15/208,227].
J. I. Colless et al., Dispersive readout of a few-electron double quantum dot with fast rf gate sensors, Phys. Rev. Lett. 110, 046805 (2013) [Cited in related U.S. Appl. No. 15/208,227].
M. J. Curry et al., Cryogenic preamplification of a single-electron-transistor using a silicon-germanium heterojunction-bipolar-transistor, App. Phys. Lett. 106, 203505 (2015) [Cited in related U.S. Appl. No. 15/208,227].
J. Medford et al., Self-consistent measurement and state tomography of an exchange-only spin qubit, Nat. Nanotechnol. 8, 654 (2013) [Cited in related U.S. Appl. No. 15/208,227].
K. Eng et al., Isotopically enhanced triple-quantum-dot qubit, Science Advances 1, e1500214 (2015) [Cited in related U.S. Appl. No. 15/208,227].
D. R. Ward et al., State-conditional coherent charge qubit oscillations in a Si/SiGe quadruple quantum dot, arXiv:1604.07956 (2016) [Cited in related U.S. Appl. No. 15/208,227].
Lim, W.H. et al., "Observation of the Single-Electron Regime in a Highly Tunable . . . ," Appl. Phys. Lett., vol. 95, Nov. 10, 2009, pp. 1-4 [Cited in related U.S. Appl. No. 15/208,227].

\* cited by examiner

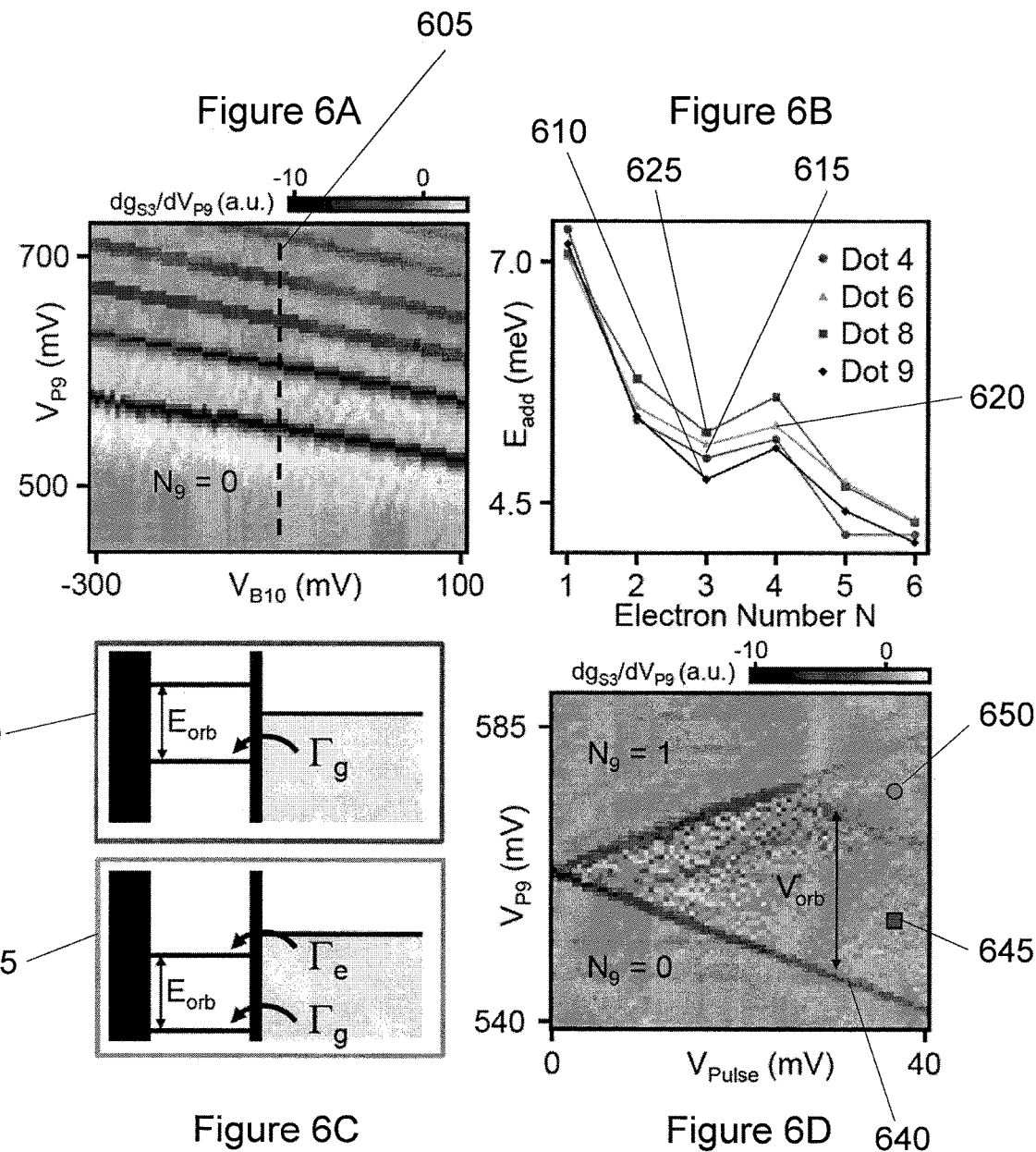

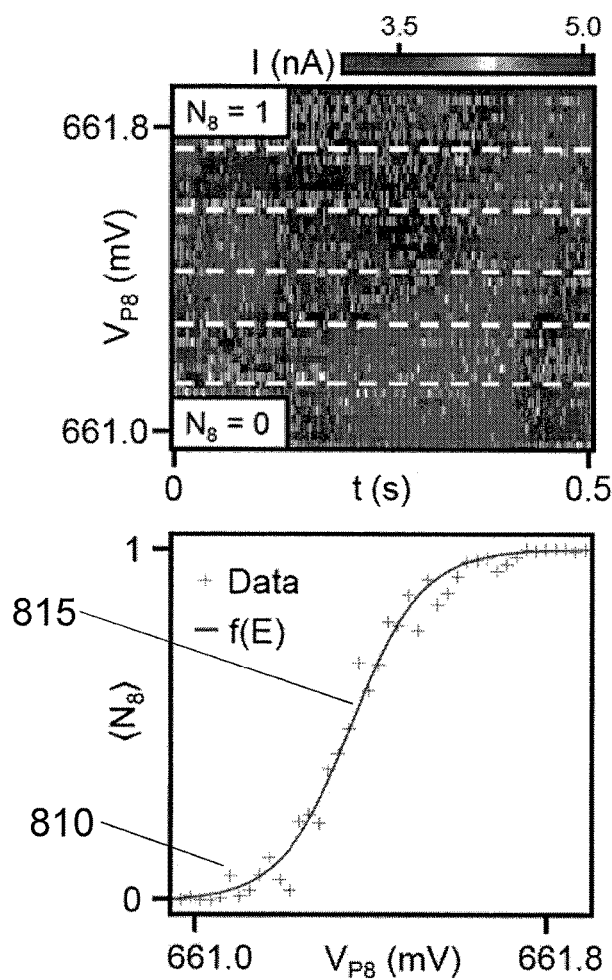
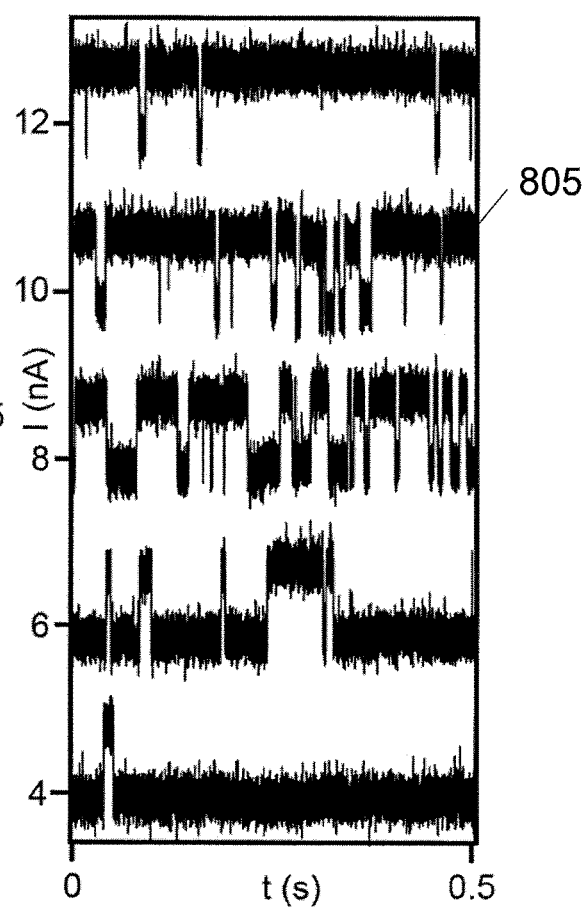
Figure 8A
Figure 8B
Figure 8C

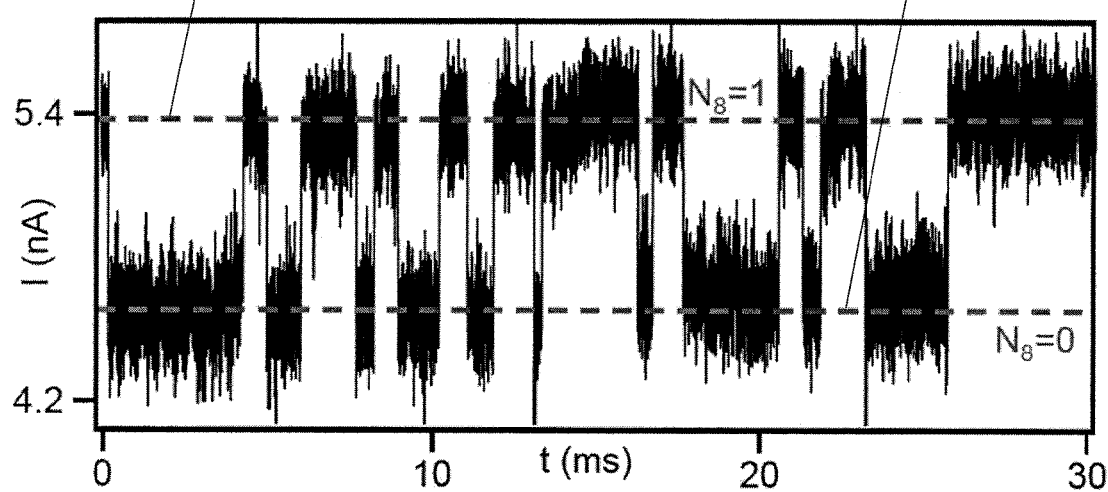
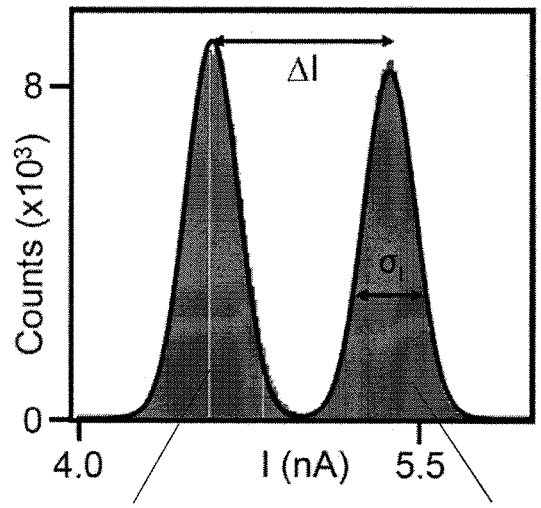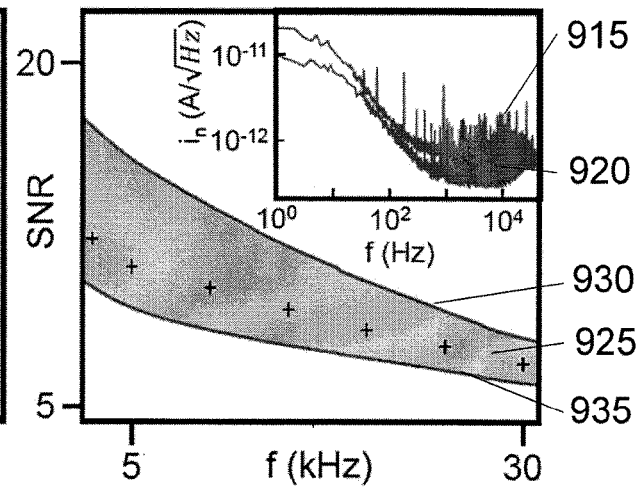
Figure 9A
Figure 9B
Figure 9C

Figure 11A
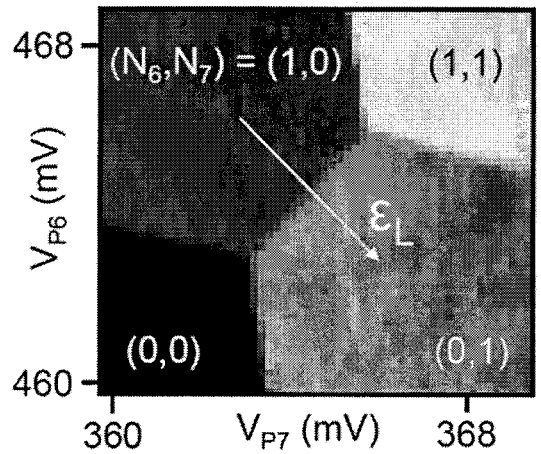
Figure 11B
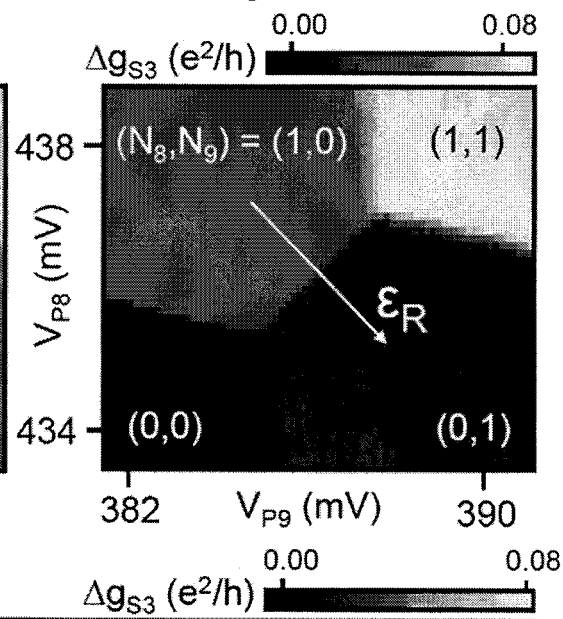
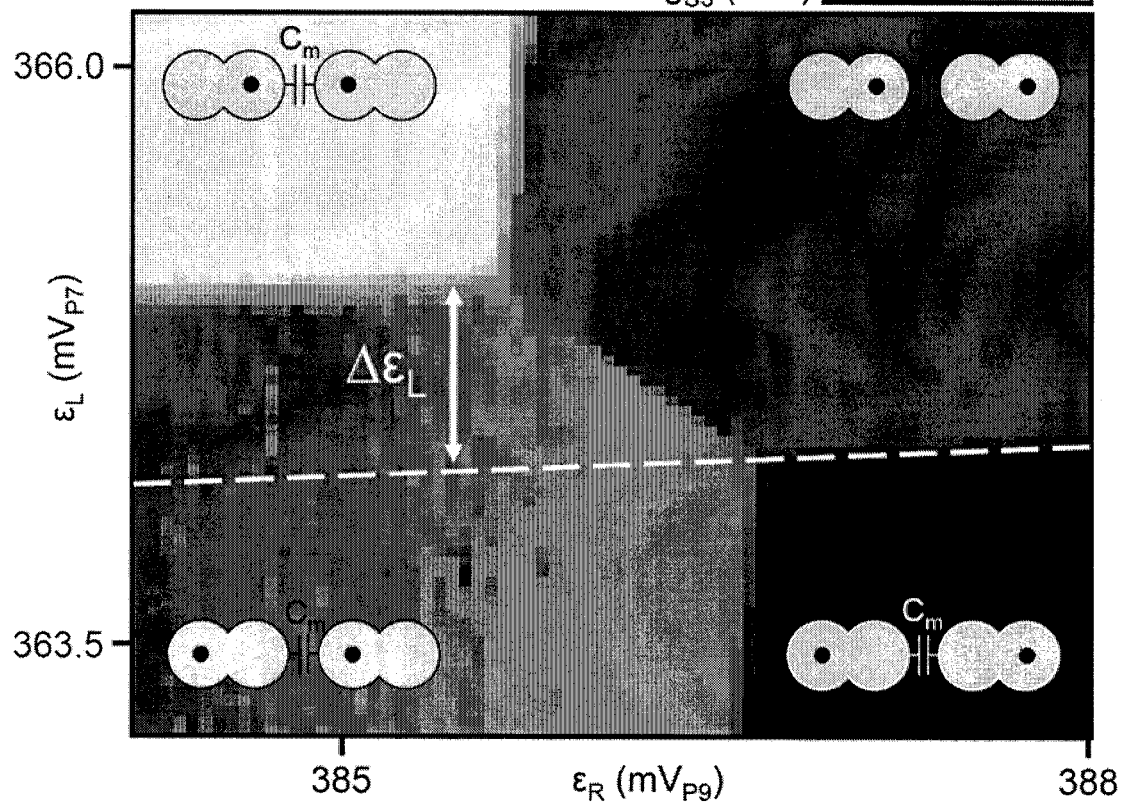
Figure 11C

SEMICONDUCTOR QUANTUM DOT DEVICE AND METHOD FOR FORMING A SCALABLE LINEAR ARRAY OF QUANTUM DOTS

CROSS REFERENCE TO RELATED APPLICATIONS

This application is a divisional of U.S. patent application Ser. No. 15/208,227, filed on Jul. 12, 2016, which is a non-provisional of and claims the benefit of U.S. Provisional Application No. 62/328,691, filed on Apr. 28, 2016, each of which are hereby incorporated by reference in their entirety.

GOVERNMENT RIGHTS

This invention was made with government support under Grant No. W911NF-15-0149 awarded by the U.S. Army, Army Research Office. The government has certain rights in the invention.

TECHNICAL FIELD

The present disclosure relates generally to quantum computing architectures, and more specifically, to exemplary embodiments of an exemplary semiconductor quantum dot device and a method for forming a scalable linear array of quantum dots.

BACKGROUND

The density of transistors in integrated circuits has been following Moore's law since its conception. (See, e.g., Reference 5). However, as the size of transistors approaches the size of a single atom, the laws of quantum physics play an increasingly dominant role in computer architectures, making it difficult for this trend to continue much longer. Despite this, the prospect of utilizing quantum mechanical phenomena in information processing offers an opportunity to increase the computational power of computers beyond what is known to be possible on even the most ideal classical computer. (See, e.g., References 5 and 6). Much like the classical computer depends on the robustness of the transistor, functional quantum computers can require an on-chip physical component with reproducible properties that can be incorporated into large scale structures.

One of the leading candidates for the quantum analog of the transistor is the gate-defined, semiconductor, quantum dot. (See, e.g., References 8 and 9). The spin state of an electron trapped in a quantum dot can be a beneficial physical system for storing quantum information. (See, e.g., References 10 and 12). Silicon ("Si") in particular, with its weak hyperfine fields, small spin-orbit coupling and lack of piezoelectric electron-phonon coupling, forms a "semiconductor vacuum" for spin states (see, e.g., Reference 13), and supports seconds-long electron spin coherence times. (See, e.g., Reference 14). However, the fabrication of reliable and scalable Si-based quantum dots has proved challenging. Independent of the need for a pure spin environment, quantum dots should have reproducible electrical properties for scaling. The large effective mass of electrons in Si, along with the typically lower mobilities of Si two-dimensional ("2D") electron gases, makes the fabrication of tightly confined, few-electron, quantum dots with reproducible properties difficult. (See, e.g., Reference 15).

Early quantum dot gate architectures were fabricated on doped Gallium Arsenide/Aluminum Gallium Arsenide ("GaAs/AlGaAs") substrates in which conduction electrons are provided by a global dopant layer, and can be confined to the GaAs/AlGaAs quantum well ("QW") interface forming a two-dimensional electron gas ("2DEG"). In these doped structures, by default, the 2DEG is filled with conduction electrons. Therefore, gate designs attempted to isolate a single conduction electron by fabricating gate electrodes in a corral pattern that could potentially create a circular barrier by applying negative voltages on the gates to deplete the 2DEG directly beneath the gates. (See, e.g., Reference 1). Devices utilizing this type of gate pattern have been referred to as depletion mode devices.

Depletion mode devices have been very successful in demonstrating the criteria for quantum computation (see, e.g., Reference 2), and are still in widespread use throughout the quantum dot community. However, there are major drawbacks to depletion mode devices with respect to control of the confinement potential and scaling. The gate patterns in depletion mode devices likely have the most control over the electrostatic potential surrounding the dot, rather than having direct control over the region of space where the electron wavefunction resides. This inability to control the electron wavefunction has led to a large variety of depletion mode gate designs, most of which do not provide a straightforward path for scaling to tens or hundreds of quantum dots.

The use of the quantum dots in quantum computing architectures generally depends on the ability to control the confinement potential of the quantum dot, and more specifically the ability to control the physically relevant parameters of the quantum dot, (e.g., tunnel coupling and the electrochemical potential). However, depletion mode devices have very limited control over the confinement potential. Simulations of the depletion mode quantum dot devices have shown that the resulting confinement potential can be much smaller than the gate dimensions. (See e.g., Reference 3). Because of such a situation, neighboring gates usually have a similar effect on the dot's tunnel couplings and electrochemical potential, and often it's not possible in depletion mode devices to tune the tunnel couplings and electrochemical potential to the desired values without going to such extreme voltages that dielectric breakdown occurs in the device. (See, e.g., Reference 4).

Quantum computing architectures require that the gate pattern be scalable. This can imply that the gate pattern must consist of unit cells that can be repeated over and over to create larger arrays. Most of the gate patterns which have been developed thus far do not consist of unit cells, and the gate patterns for double and triple quantum dots do not resemble the gate patterns for single quantum dots. This can make it unclear how to take existing gate patterns and extend (e.g., scale) them to tens or hundreds of quantum dots.

Thus, it may be beneficial to provide an exemplary semiconductor quantum dot device, which can overcome at least some of the deficiencies described herein above.

SUMMARY

To that end, in order to overcome at least some of the deficiencies described herein above, an exemplary quantum dot device can be provided, which can include, for example, at least three conductive layers and at least two insulating layers electrically which insulate the conductive layers from one another. One of the conductive layers can be composed of a different material than the other two of the conductive layers. The conductive layers can include or be composed of (i) aluminum, (ii) gold, (iii) copper and/or (iv) polysilicon.

As an alternative, the conductive layers can be composed at least partially of (i) aluminum, (ii) gold, (iii) copper and/or (iv) polysilicon. The insulating layers can be composed of (i) silicon oxide, (ii) silicon nitride or (iii) aluminum oxide.

In some exemplary embodiments of the present disclosure, the conductive layers can be composed of a metallic material having a purity rate of over 90% (e.g., 99.9%). Each of the conductive layers can have a thickness of less than about 200 nm, or even less than about 100 nm. Each of the insulating layers can have a thickness of less than about 10 nm, or even less than about 4 nm. Each of the insulating layers can be in direct contact with at least two of the conductive layers.

In certain exemplary embodiments of the present disclosure, the exemplary quantum dot device can include at least three further conductive layers and at least two further insulating layers electrically insulating the further conductive layers, where the further conductive layers and the at least two further insulating layers can be electrically coupled to the conductive layers and the insulating layers.

In some exemplary embodiments of the present disclosure, the conductive layers can be fabricated or provided on a semiconductor substrate, which can include, for example, (i) a silicon/silicon-germanium (Si/SiGe) substrate, (ii) a silicon dioxide on silicon substrate and/or (iii) a GaAs/AlGaAs heterostructure. A first one of the conductive layers can be configured to operate as a screening layer, a second one of the conductive layers can be configured to accumulate electrons in a two-dimensional electron gas ("2DEG") and a third one of the conductive layers can be configured to tune a barrier(s) between regions of the 2DEG accumulated by the second conductive layer. Each of the conductive layers can have a different voltage level applied therethrough. Connections between the conductive layers and the insulating layers can cause single electrons to be shuttled through quantum dots of the device using voltage pulses.

According to further exemplary embodiments of the present disclosure, a quantum dot device can be provided which can comprise a repeating quantum dot cell structure having repeated cells. For example, each of the repeated cells can be electrically connected to another one of the repeated cells which is adjacent thereto. Electrically-connected quantum dots of at least one of the repeated cells can be provided in a nearest neighbor configuration. At least one of the repeating cells can include at least two quantum dots (or at least three quantum dots). Each of the repeating cells can include at least three conductive layers and at least two insulating layers electrically insulating the at least three conductive layers from one another. The charge state of each of the repeating cells can be (i) measurable, (ii) readout using a quantum point contact, (iii) readout using a charge sensor quantum dot, and/or (iv) readout through the use of a radio frequency measurement. Connections between the connected cells can cause single electrons to be shuttled through quantum dots of the device using voltage pulses.

According to a further exemplary embodiment of the present disclosure, a quantum dot arrangement can be provided, which can include at least three quantum dot devices, where each of the quantum dot devices can be electrically connected to an adjacent one of the quantum dot devices. At least one of the quantum dot devices can be provided in a nearest neighbor configuration with another one of the quantum dot devices. The quantum dot devices can include at least seven quantum dot devices, or at least nine quantum dot devices.

In some exemplary embodiments of the present disclosure, each of the quantum dot devices can include at least three conductive layers and at least two insulating layers electrically insulating the at least three conductive layers from one another.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which:

FIG. 6A is an exemplary plot illustrating a charge stability diagram of quantum dot 9, according to an exemplary embodiment of the present disclosure;

FIG. 6B is an exemplary graph illustrating the addition of energy plotted as a function of electron number N for dots 4, 6, 8 and 9, according to an exemplary embodiment of the present disclosure;

FIG. 6C is a set of exemplary diagrams illustrating pulsed gate spectroscopy, according to an exemplary embodiment of the present disclosure;

FIG. 6D is an exemplary diagram illustrating an orbital excited state being visible for dot 9 according to an exemplary embodiment of the present disclosure;

FIG. 8A is an exemplary graph illustrating the current through sensor dot 3 as a function of $V_{P8}$ and time near the charge transition according to an exemplary embodiment of the present disclosure;

FIG. 8B is an exemplary graph illustrating the time series extracted from the data shown in FIG. 8A at positions shown by the dashed lines in FIG. 8A, according to an exemplary embodiment of the present disclosure;

FIG. 8C is an exemplary graph showing the time-averaged quantum dot 8 occupation extracted from the data shown in FIG. 8A, and plotted as a function of $V_{P8}$, according to an exemplary embodiment of the present disclosure;

FIG. 9A is an exemplary graph showing a time series of the current through sensor dot 3, with dot 8 configured at the charge transition, according to an exemplary embodiment of the present disclosure;

FIG. 9B is an exemplary graph illustrating a histogram of a one second time series showing two Gaussian peaks, according to an exemplary embodiment of the present disclosure;

FIG. 9C is an exemplary graph illustrating the signal-to-noise ratio plotted as a function of the filter cutoff frequency, according to an exemplary embodiment of the present disclosure;

FIGS. 11A and 11B are exemplary graphs illustrating how dots 6 and 7, and dots 8 and 9, are simultaneously tuned up to for two double quantum dots ("DQDs"), according to an exemplary embodiment of the present disclosure;

FIG. 11C is an exemplary graph illustrating that the capacitive interaction between the two DQDs can be extracted by measuring the quadruple dot charge stability diagram, according to an exemplary embodiment of the present disclosure;

Figure 1:
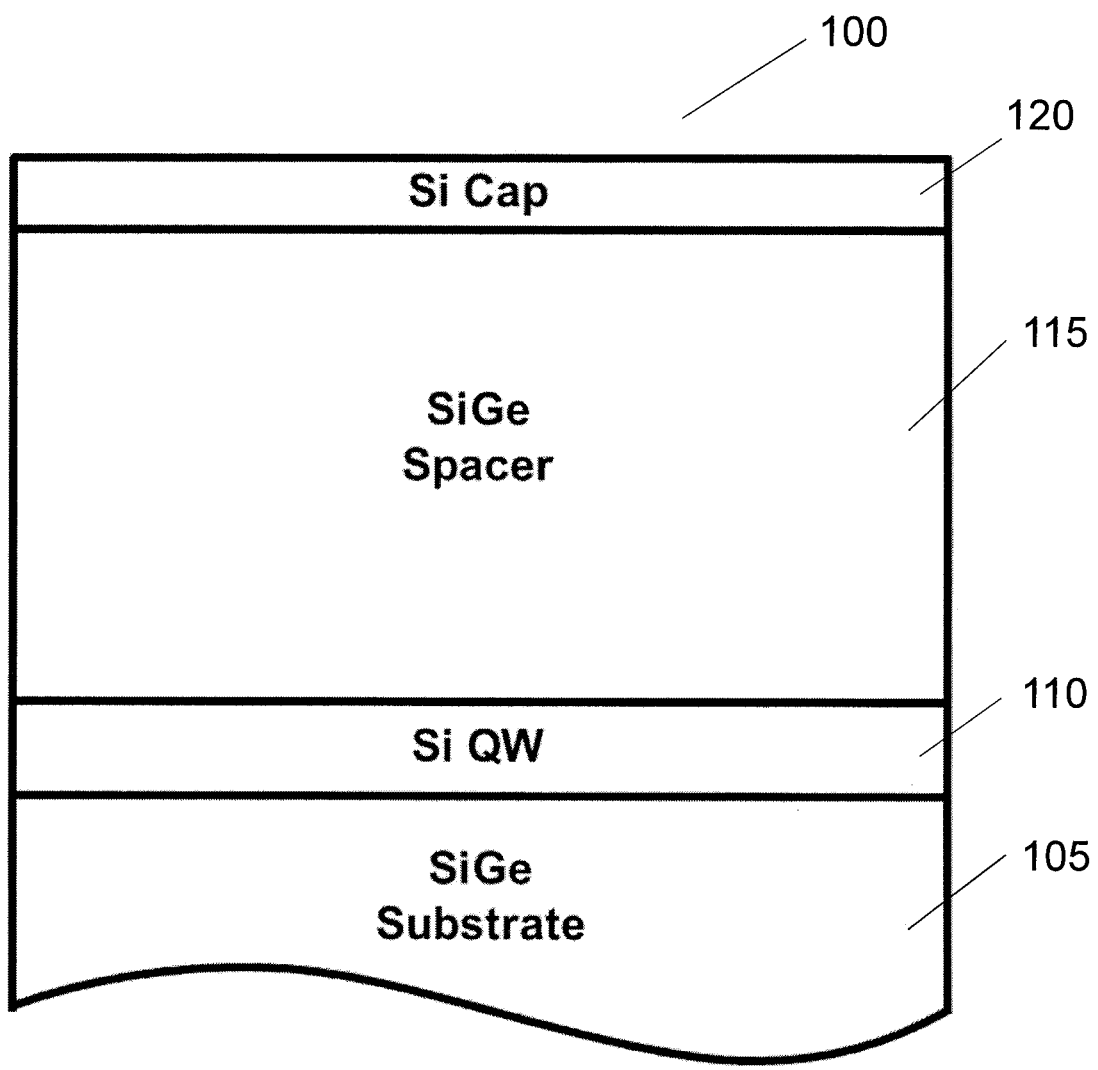
FIG. 1 is an illustration of a cross section of the exemplary Si/SiGe substrate showing the Si quantum well, SiGe spacer and Si cap according to an exemplary embodiment of the present disclosure.

Throughout the drawings, the same reference numerals and characters, unless otherwise stated, are used to denote like features, elements, components or portions of the illustrated embodiments. Moreover, while the present disclosure will now be described in detail with reference to the figures, it is done so in connection with the illustrative embodiments and is not limited by the particular embodiments illustrated in the figures and the appended claims.

DETAILED DESCRIPTION OF ILLUSTRATIVE EMBODIMENTS

Thus, as described herein, an exemplary quantum dot device can be provided, which can be or include an aggressively scaled semiconductor quantum dot device. The exemplary device can include 12 quantum dots, nine of which can be arranged in a linear array, and three that can be used as sensitive charge detectors. The exemplary device according to an exemplary embodiment of the present disclosure can utilize an overlapping metallic gate architecture to facilitate tight electronic confinement (see, e.g., Reference 16), while an undoped heterostructure can provide a clean, high mobility interface (see, e.g., Reference 17) for the formation of well-behaved quantum dots with reproducible characteristics.

The exemplary gate pattern can be fabricated or otherwise placed on top of a semiconductor substrate (e.g., an undoped silicon/silicon-germanium ("Si/SiGe") substrate). A cross section of the exemplary substrate 100 is shown in FIG. 1. A pure Si QW layer 110 can be grown on top of a SiGe substrate 105, followed by a SiGe spacer layer 115. A thin Si cap layer 120 can be used to protect the SiGe spacer layer 115 during further processing. Ohmic contacts can be made to the QW using, for example, locally doped regions of the wafer. Various other suitable semiconductor substrates (e.g., quantum well structures) can be used, which can include, for example, silicon dioxide on silicon and/or AlGaAs/GaAs heterostructures.

Figure 2A:
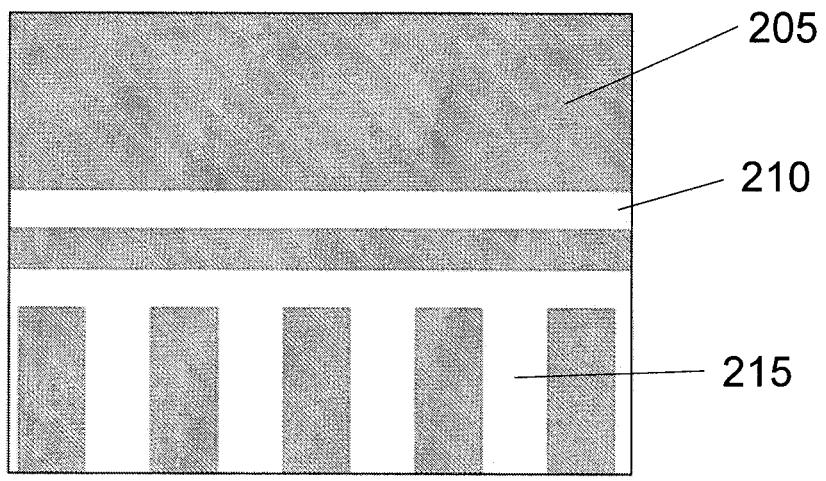
FIGS. 2A to 2C are exemplary diagrams of three exemplary layers of the gate pattern according to an exemplary embodiment of the present disclosure.
Figure 2B:
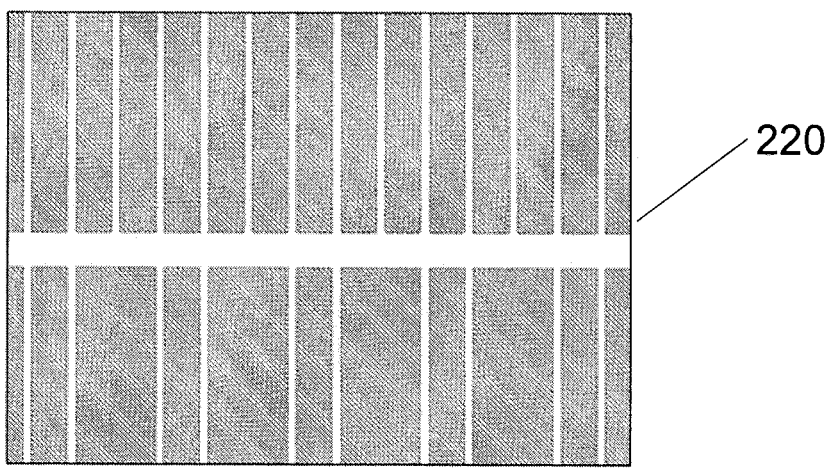
Figure 2C:
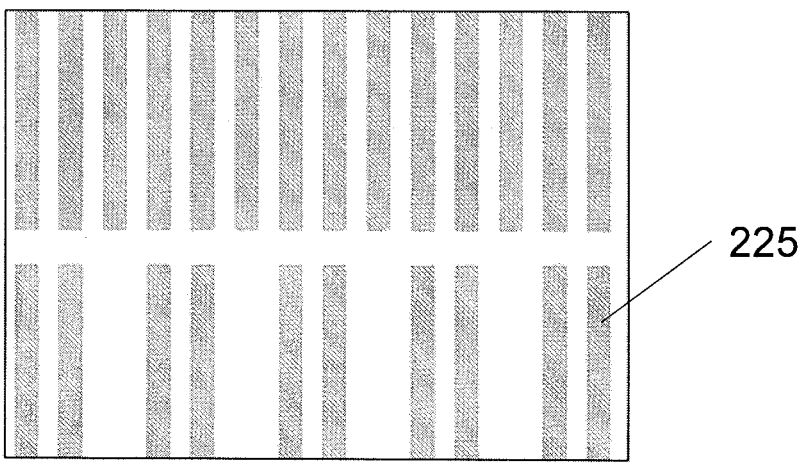

The exemplary gate pattern (e.g., quantum dot) can include, for example, three conductive (e.g., metallic) layers. Exemplary suitable materials for the conductive layers can include, but are not limited to, aluminum, gold, copper and/or polysilicon. The exemplary layers can be composed almost entirely of the respective material (e.g., having a 99.9% purity). Alternatively, the conductive layers can be composed partially of the respective material. Each such layer can be exposed to an oxygen/argon mixture directly, after metallization, in vacuum in order to facilitate an insulating layer (e.g., an oxide layer) to form on the outside of the metal. This exemplary layer of oxide can electrically isolate each layer from further layers of metal. The exemplary gate pattern of the first layer is shown in FIG. 2A. The first layer of metal 205 can operate as a screening layer. Such screening layer can define a single-dimensional channel 210 that can contain the array of quantum dots, as well as adjacent transport channels 215 that can contain charge sensing quantum dots. The exemplary second gate layer 220, which can be on top of or adjacent to the first layer, is shown in FIG. 2B, and can be used to accumulate electrons. These exemplary gates can be held at relatively positive voltages, and can accumulate electrons underneath them through openings 215 in the screening layer. Gate electrodes in each layer can have their own respective voltage (e.g., voltage level) applied therethrough. The exemplary third layer, which can be on top of or adjacent to the second layer, is shown in FIG. 2C, can contain barrier gate electrodes 225 that can be used to tune the barriers between regions of the two-dimensional electron gas ("2DEG"), which can be accumulated by the second layer.

According to certain exemplary embodiments of the present disclosure, an exemplary thickness of the conductive layers can be about 200 nm or less (e.g., within 5%-10% of such number). According to addition exemplary embodiments of the present disclosure, the exemplary thickness of the conductive layers can be about 100 nm (e.g., within 5%-10% of such number)). An exemplary thickness of the insulating layer can be about 10 nm or less (e.g., within 5%-10% of such number)). In further exemplary embodiments of the present disclosure, the exemplary thickness of the insulating layer can be about 4 nm or less (e.g., within 5%-10% of such number)). Various suitable exemplary insulating materials can be used, which can include, for example, silicon oxide, silicon nitride and/or aluminum oxide.

Figure 3A:
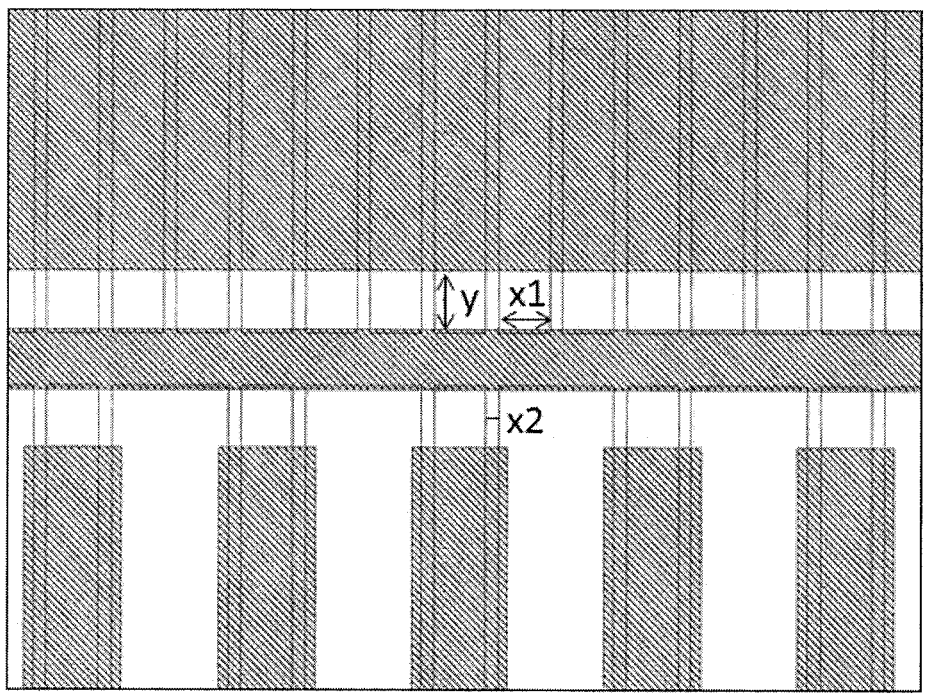
FIGS. 3A and 3B are exemplary diagrams illustrating the first and second layers shown in FIGS. 2A-2C overlaid on each other as well as the resulting two-dimensional electron gas in the quantum well according to an exemplary embodiment of the present disclosure.

The second and third layers of the exemplary device according to the exemplary embodiment of the present disclosure can have or provide control over regions of the 2DEG, which can be much smaller than their full lithographic dimensions. This can be achieved by screening. Gates in the second layer can likely affect only the 2DEG through the opening in the first layer. This exemplary configuration can reduce the region which they control to x1 by y, as illustrated in the diagram of FIG. 3A. Gates in the third layer can be restricted to even smaller gaps in the first two layers such that the region of the 2DEG, which they have control over, can be x2 by y. By utilizing screening in such exemplary manner, it is possible to provide each gate with a more local control of the confinement potential. Thus, there can be less cross capacitance. This reduced cross capacitance can make it significantly easier to tune the physically relevant parameters of the dot.

Figure 3B:
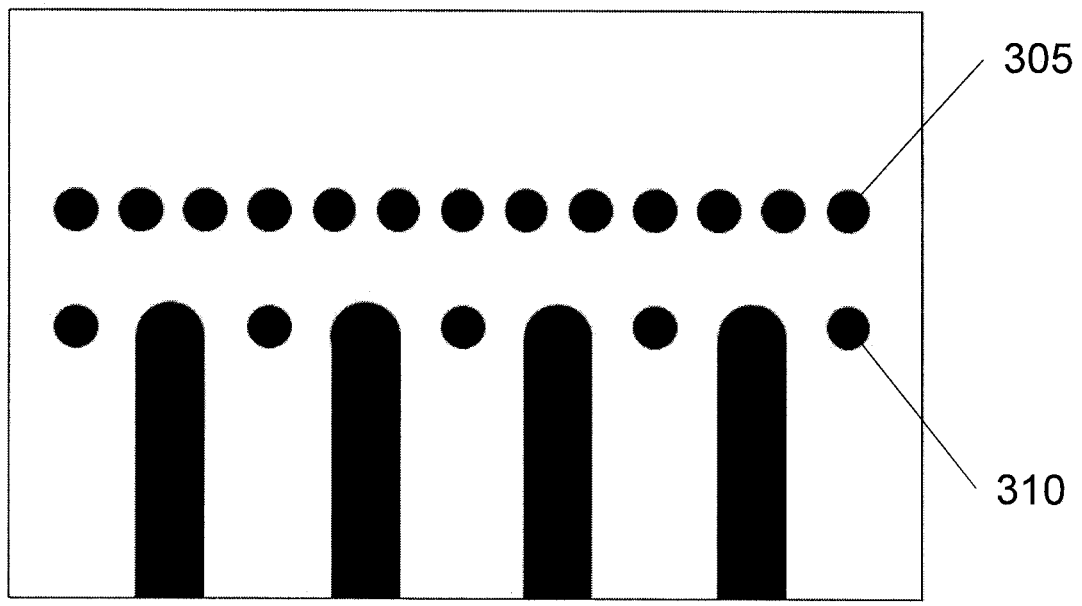

The charge occupation of the exemplary quantum dots can be read out through the adjacent charge sensing quantum dots. The exemplary locations of the dots 305 in the main array, and the sensor dots 310, are illustrated in FIG. 3B. For example, one charge sensor can be placed for every three quantum dots in the main array. The conductance through the charge sensing quantum dots will exhibit Coulomb blockade peaks. By setting the conductance on the side of one of these Coulomb blockade peaks, changes in the charge state of nearby quantum dots in the main array can create a change in the conductance through the charge sensor. From this, it can be possible to track the movement of charge through the main array of quantum dots.

The exemplary manner in which the number of gates can scale with the number of quantum dots can be considered for the exemplary scaling. For example, each dot in the main array of dots can be defined by one plunger gate and two barrier gates. Each barrier gate can be shared between adjacent dots, except for the first and last dot of the array which each can have a barrier separating it from the reservoirs on either side of the array. Therefore, the number of plunger and barrier gates can scale as 2N+1, with N equal to the number of dots in the array. It can be beneficial that the number of gates, and the length of the array, scale linearly with N. This can ensure that it can be feasible to scale to a large N without needing a fundamental design change above some number of quantum dots.

Figure 4:
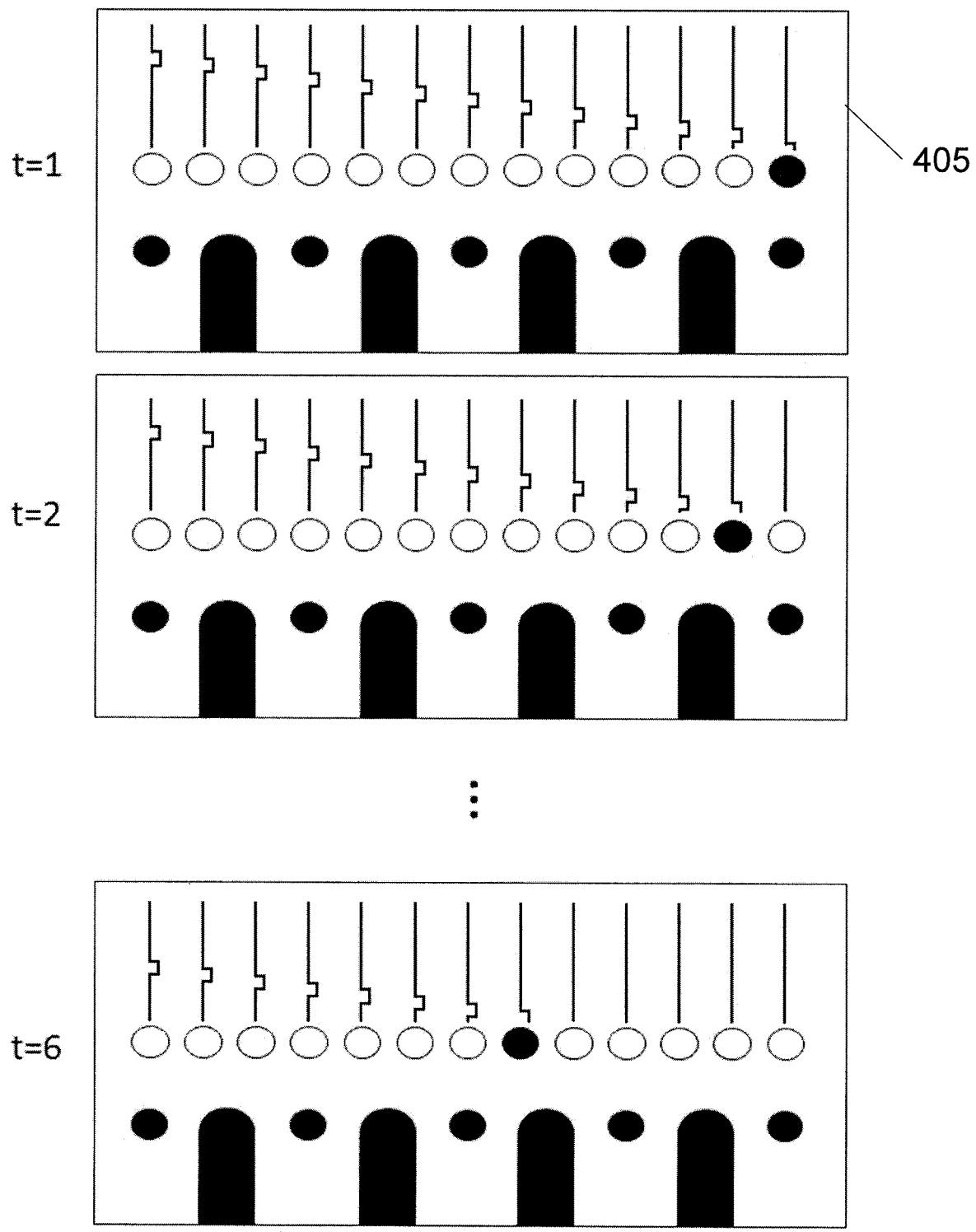
FIG. 4 is a diagram illustrating the use of timed pulses to shuttle an electron through the main array of quantum dots according to an exemplary embodiment of the present disclosure.

This exemplary device described herein can be used to shuttle single electrons through the 2DEG in a controlled manner. This can be achieved by applying a series of timed voltage pules 405 to the gates as illustrated in FIG. 4. For example, the voltage pulses 405 hit each quantum dot consecutively leading to sequential tunneling of the electron through each quantum dot. The ability to shuttle single charges through arrays of quantum dots can be used to move information through a quantum computer.

Exemplary Linear Gate Architecture

Figure 5A:
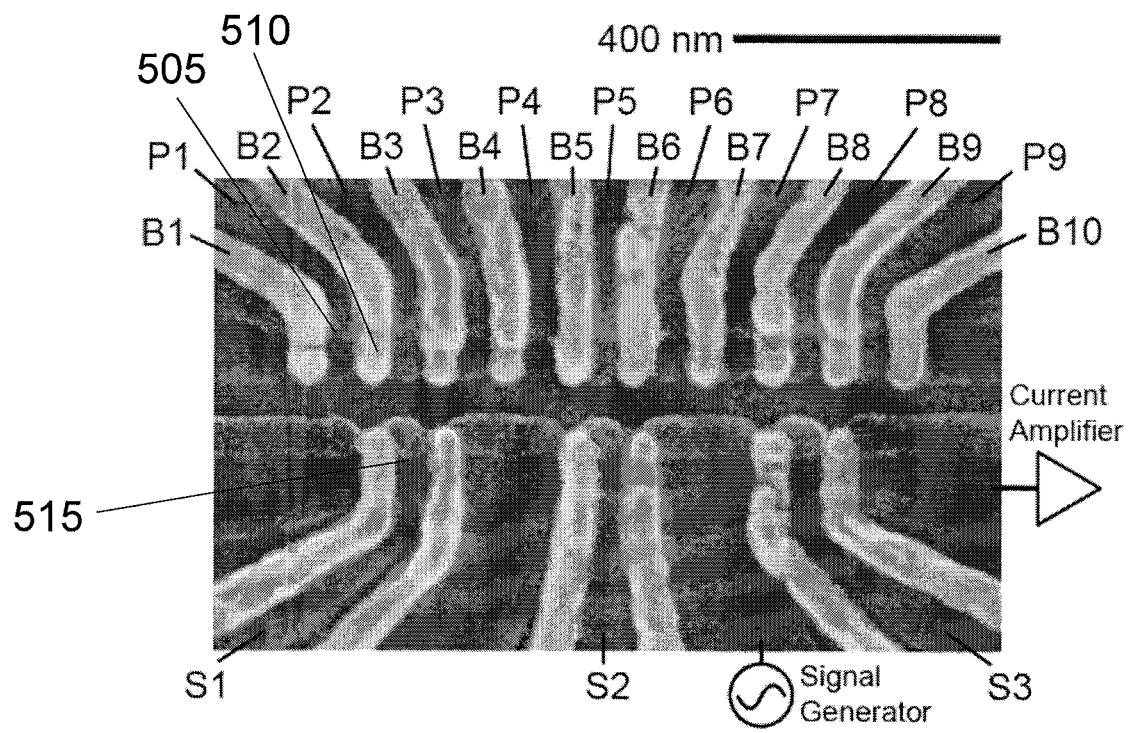
FIG. 5A is an exemplary false-color scanning electron microscope image illustrating the overlapping gate architecture according to an exemplary embodiment of the present disclosure.
Figure 5B:
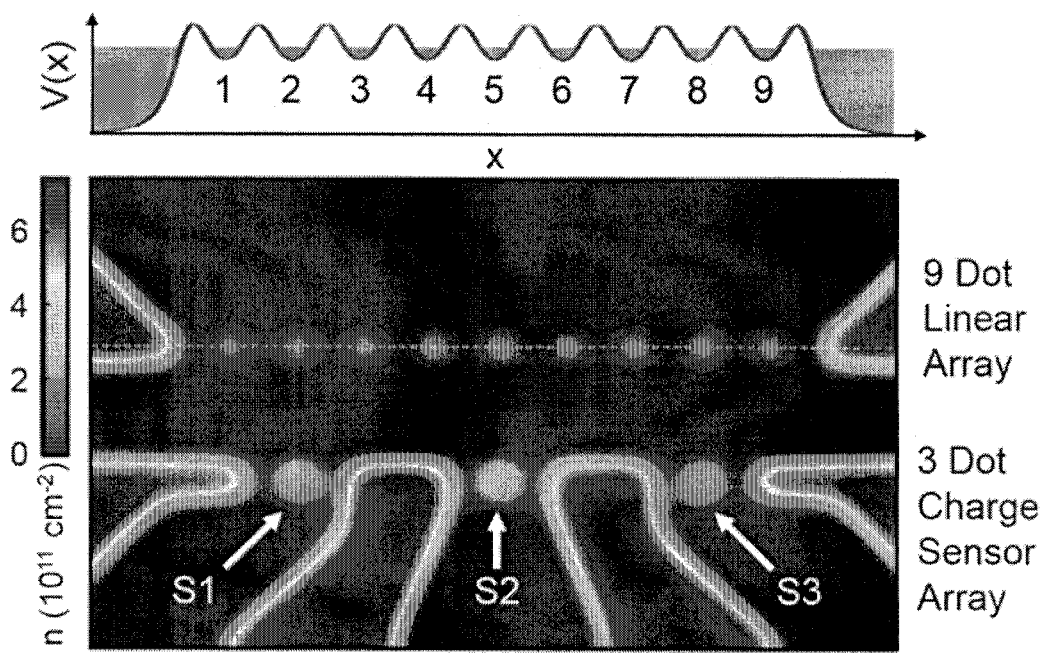
FIG. 5B is an image produced by an exemplary COMSOL simulation, and a graph illustrating the confinement potential, according to an exemplary embodiment of the present disclosure.

A false-colored scanning electron microscope ("SEM") image of the device is shown in FIG. 5A, and a COMSOL simulation of the electron density n in the plane of the quantum well is shown in FIG. 5B. Tight electronic confinement can be achieved, for example, using an overlapping aluminum gate architecture. (See, e.g., Reference 16). As shown in such drawings, in the upper half of the exemplary device, two sets of aluminum gate electrodes, with a pitch of about 100 nm, can be interleaved to form a linear array of 9 quantum dots. A plunger gate can control the chemical potential of each quantum dot 505, while barrier gates can control the tunnel coupling of adjacent dots 510. An aluminum screening layer can restrict the action of the tuning gates to a one-dimensional ("1D") channel. (See, e.g., Reference 16). High sensitivity single electron charge detection can be achieved using three single dot charge sensors defined in a second one-dimensional channel that can be formed in the lower half of the device 515.

The scalability of the exemplary device can be illustrated from its repeating unit cell structure. Each exemplary unit cell can consist of three quantum dots and a charge sensor. The exemplary device can be constructed, for example, by concatenating three of these unit cells. Scaling to arrays of arbitrary length can be achieved by adding additional unit cells. The overlapping gate architecture demonstrated here has roughly about 4.5 times the areal density of a widely-used double dot depletion mode gate pattern; 9 dots and 3 charge sensors were fit in an area of ~1.5 μm², the same area as a GaAs double quantum dot and its two quantum point contact charge detectors. (See, e.g., Reference 2).

Exemplary Characterization of the 9 Dot Array

Scaling to large arrays of quantum dots can benefit from uniform and reliable single quantum dot characteristics. For example, three figures of merit can be used to characterize the reproducibility of the linear array: the lever arm a, charging energy $E_c$, and orbital excited state energy $E_{orb}$. A single quantum dot can be formed under each plunger gate, with the neighboring quantum dots tuned to the many electron regime and extract a, $E_c$ and $E_{orb}$ for each dot using a combination of transport measurements, charge sensing and pulsed gate spectroscopy.

Lever arms can be extracted from transport measurements of Coulomb diamonds at the N=0 to 1 transition, where N can refer to the number of electrons in the dot. The charge state of each dot can be read out by measuring the conductance through the nearest single dot charge sensor. As an example, the diagram of FIG. 6A shows the charge stability of a quantum dot formed under plunger gate P9. As shown in FIG. 6A, the derivative of the charge sensor conductance, $dg_{S3}/dV_{p9}$, can be plotted as a function of $V_{p9}$ and $V_{B10}$. The lack of charge transitions for low values of $V_{p9}$ can indicate that dot 9 (e.g., element 605) has been emptied of free electrons, reaching $N_9$=0 charge occupancy. Addition voltages for dot 9 can be extracted along the vertical dashed line 605 shown in FIG. 6A, and converted into addition energies, $E_{add}$, using ∝. These addition energies are plotted in the graph 610 shown FIG. 6B. For example, the addition energies for dots 4, 6 and 8 (e.g., elements 615, 620 and 625, respectively) are shown in FIG. 6B. The increase in $E_{add}$ at the N=4 to 5 charge transition can be attributed to shell filling of the low lying spin and valley degrees of freedom. (See, e.g., References 18 and 19).

Pulsed gate spectroscopy can be performed in each dot at the N=0 to 1 charge transition in order to extract the orbital excited state energy $E_{orb}$. (See, e.g., References 20 and 21). An about 500 Hz square wave, with peak-to-peak amplitude, $V_{pulse}$, can be added to the dc plunger gate voltage to repeatedly load and unload an electron onto the dot. For a small $V_{pulse}$, only the ground state can be pulled below the Fermi level of the lead (e.g., see diagram 630 shown in FIG. 6C) and an electron tunnels onto the dot with a rate $\Gamma_g$. When the pulse amplitude can exceed $V_{orb}$, the electron can load into either the ground state or the first excited state (e.g., diagram 635 shown in FIG. 6C). The effective loading rate can be increased due to the contribution from the excited state $\Gamma_e$, and can be visible in the charge sensing data. The change in conductance due to the ground state creates the sloped line 640 in FIG. 6(D). The region marked by the blue square 645 in FIG. 6(D) corresponds to the configuration of 630, where only the ground state is pulsed below the Fermi level, while the region marked by the green circle 650 corresponds to the configuration of 635, where both the ground state and excited states are pulsed below the Fermi level. The transition from region 645 to 650 occurs at a voltage $V_{orb}$ above the ground state line 640. From these data, an orbital excited state energy $E_{orb}=\alpha V_{orb}=3.4$ meV can be extracted for dot 9.

Similar characterization can be performed on dots 1-8, and the results are summarized in Table I below. The averaged figures of merit can be $\alpha=0.13\pm0.01$ meV/mV, $E_c=6.9\pm0.7$ meV, and $E_{orb}=3.0\pm0.5$ meV. These exemplary charging energies can generally be larger than those obtained with other device designs in Si/SiGe due to the tight confinement potential generated by the overlapping gate architecture. For example, depletion mode devices achieved charging energies of less than about 2 meV (see, e.g., Reference 22), while enhancement mode architectures have yielded charging energies close to about 5 meV. (See, e.g., Reference 19). Moreover, the large orbital excited state energies can be comparable to those measured in GaAs devices, which has an effective mass that can be nearly three times smaller than Si. (See, e.g., Reference 9).

TABLE I

Lever-arm conversion between gate voltage and energy α, charging energy $E_c$, and orbital excited state energy $E_{orb}$ for each of the nine dots in the linear array.

| Dot | α (meV/mV) | $E_c$ (meV) | $E_{orb}$ (meV) |
|---|---|---|---|
| 1 | 0.14 | 6.6 | 2.7 |
| 2 | 0.13 | 6.1 | 2.6 |
| 3 | 0.11 | 5.6 | 2.1 |
| 4 | 0.14 | 7.3 | 3.3 |
| 5 | 0.14 | 7.2 | 3.3 |
| 6 | 0.14 | 7.1 | 3.0 |
| 7 | 0.14 | 7.7 | 3.5 |
| 8 | 0.14 | 7.1 | 3.4 |
| 9 | 0.13 | 7.2 | 3.4 |

Exemplary Sensitive Charge Detection

An exemplary criteria for quantum information processing can be high fidelity qubit readout. For both single shot readout of an individual spin (see, e.g., References 23 and 24), and spin-to-charge conversion in double (see, e.g., Reference 2) and triple quantum dot qubits (see, e.g., Reference 25), this can translate to a need for a high fidelity charge state readout. The exemplary device can sensitively detect charge using the exemplary charge sensor array. The three sensor dots can provide good coverage over the entire 9 dot array.

Figure 7A:
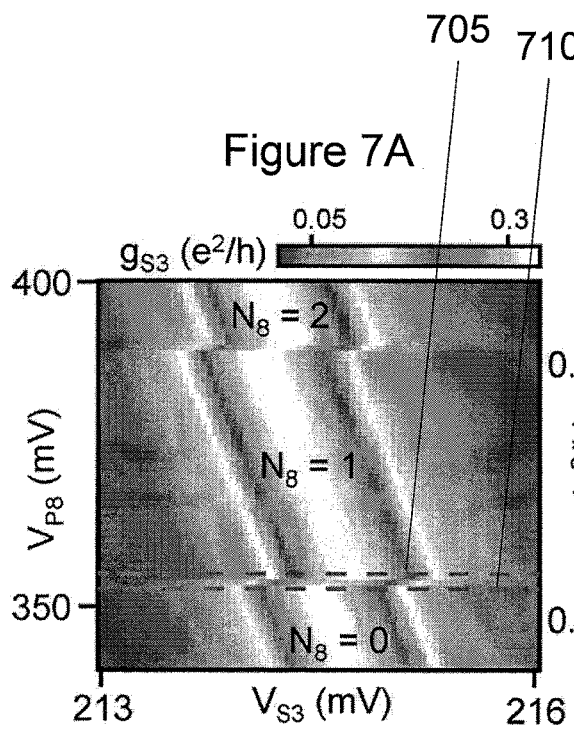
FIG. 7A is an exemplary image illustrating a Coulomb blockade peak for sensor dot 3, according to an exemplary embodiment of the present disclosure.
Figure 7B:
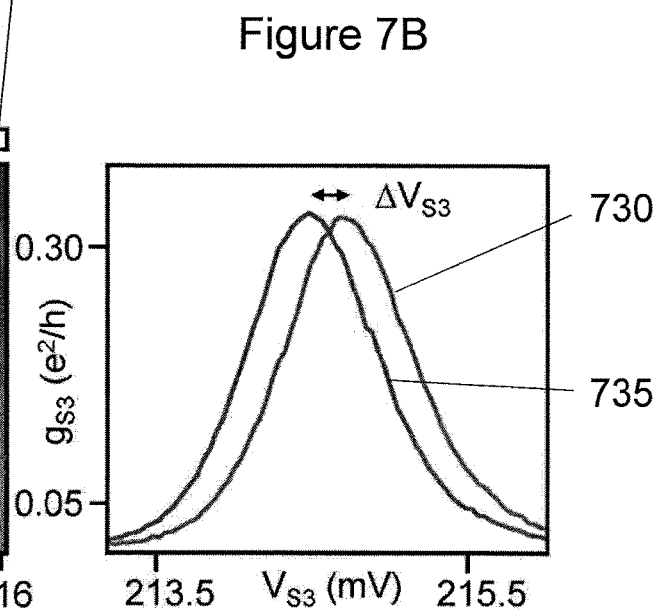
FIG. 7B is an exemplary graph illustrating $g_{S3}$ measured at the dashed lines from FIG. 7A, according to an exemplary embodiment of the present disclosure.
Figure 7C:
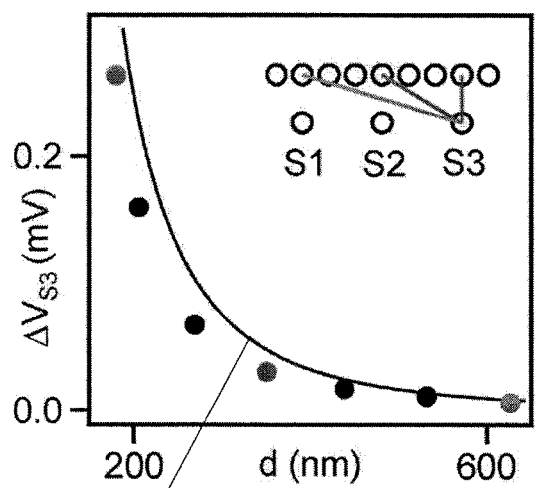
FIG. 7C is an exemplary graph illustrating $\Delta V_{S3}$ measured for dots 2 through 8, according to an exemplary embodiment of the present disclosure.

In order to characterize the charge sensor performance, the shift in a charge sensor Coulomb blockade peak due to a change in the charge occupancy of a nearby dot in the linear array can be measured. For example, FIG. 7A shows a graph illustrating the conductance through charge sensor 3, $g_{S3}$, as a function of $V_{P8}$ and $V_{S3}$. A Coulomb blockade peak is visible in the sensor dot conductance, and it abruptly shifts each time an electron can be added to quantum dot 8. For example, peak 730 in FIG. 7(B) is plotting the peak taken at the position of a dashed line 705 in FIG. 7(A), and peak 735 in FIG. 7(B) is plotting the peak taken at the position of a dashed line 710 in FIG. 7(A). These two Coulomb blockade peak are on either side of the $N_8=0$ to 1 charge transition. A peak shift of $\Delta V_{S3}=0.26$ mV at the $N_8=0$ to 1 charge transition can be measured from the displacement of the two peaks 730, 735. The shift in the charge sensor 3 Coulomb blockade peak position can also be measured for dots 2-7, and is plotted in the graph shown in FIG. 7C as a function of the geometric distance, d, between each dot and the sensor dot. The shift can fall off rapidly as $1/d^3$.

Predictions for the shifts in the sensor dot Coulomb blockade peak position can be obtained by computing the capacitances of the device. A three-dimensional ("3D") model of the device can be constructed based on the wafer growth profile and lithographic gate dimensions, representing the dots as metallic cylinders with a radius of about 12 nm and a height of about 5 nm. The capacitances of the exemplary device can be computed using a fast-multipole-moment solver (e.g., FastCap). (See, e.g., Reference 26). The expected shift can be computed or otherwise determined from the simulated capacitances using $$\Delta V_{S3} = \frac{e^2 C_m}{C_p C_t},$$

where $C_m$ can be the mutual capacitance between the sensor dot and the single-electron dot, $C_p$ can be the capacitance between the sensor dot and its plunger gate, and $C_t$ can be the total single-electron dot capacitance. (See, e.g., Reference 27). The computed/determined shift can scale as $\Delta V_{S3}(d) \propto 1/d^{2.96}$, and can compare with the experimental data. (See, e.g., line 740 shown in FIG. 7C).

Figure 7D:
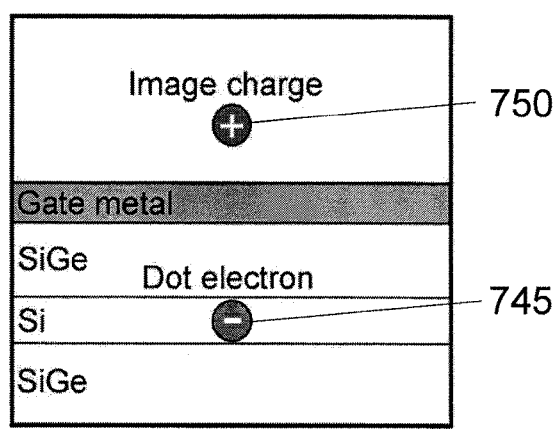
FIG. 7D is an exemplary diagram illustrating that the power law dependence can be qualitatively understood as the field of a dipole that is formed by an electron in the quantum well and its positive charge, according to an exemplary embodiment of the present disclosure.

As in the case of a parallel plate capacitor, the capacitance can be expected to scale as 1/d. However, the overlapping gate architecture covers nearly the entire Si/SiGe heterostructure with metal, resulting in a significant amount of screening. The impact of this screening can be illustrated using the diagram shown in FIG. 7D. An electron 745 trapped in a quantum dot can induce a positive image 750 charge in the gate metal above. The resulting electric field due to the electron and its image charge can be that of a dipole, which can fall off with a $1/r^3$ dependence.

Exemplary Real-Time Charge Detection

The ability to resolve real-time charge dynamics can facilitate the study of fundamental physical phenomena at the level of a single electron. (See, e.g., References 28 and 26). It can also enable a single-shot readout of single electron spin states (see, e.g., References 23 and 24), and the discrimination of two-electron singlet and triplet spin states. (See, e.g., Reference 2). The exemplary device can have a high sensitivity charge detection through the observation of real-time tunneling events. (See, e.g., References 30 and 31). Through a quantitative analysis of the charge sensor response, a charge sensitivity of $8.2 \times 10^{-4}$ e/$\sqrt{H_z}$ can be extracted.

FIG. 8A shows a color-scale plot of the current I through sensor dot 3 as a function of time, for a range of plunger gate voltages $V_{P8}$ with dot 8 tuned up near the $N_8=0$ to 1 charge transition. Five time series (e.g., element 805) extracted from this data set are plotted in the graph shown in FIG. 8B. The lowest time-series shown in FIG. 8B was acquired with $V_{P8}=661.12$ mV. Thus, the exemplary dot can be empty nearly all of the time. With $V_{P8}$ slightly increased, the current shows signatures of real-time single electron tunneling events, and switches between two levels corresponding to the $N_8=0$ and 1 charge states. The dwell time in the $N_8=1$ charge state increases with increasing $V_{P8}$. Using a threshold to discriminate between the charge states, the time-averaged occupation of dot 8, $\langle N_8 \rangle$, can be plotted as a function of $V_{P8}$ in the graph shown in FIG. 8C, which illustrates Data 810 and f(E) 815. The population follows a Fermi function f(E) as the chemical potential of the dot level can be lowered past the Fermi level of the lead. The data shown in the graph of FIG. 8C can be nicely fit to a Fermi function with an electron temperature $T_e$=120 mK.

An exemplary detailed analysis of the real-time single electron tunneling events can be used to determine the charge sensor signal-to-noise ratio ("SNR") and sensitivity. A one-second time series of the current through the charge sensor with dot 8 tuned to the $N_8$=0 to 1 charge degeneracy point can be measured. The data can be acquired at a sampling rate of about 500 kHz and a Kaiser-Bessel finite impulse response ("FIR") filter can be used to reduce the effective measurement bandwidth to about 30 kHz. An about 30 ms long segment of this time series is shown in the exemplary graph of FIG. 9A. Real time tunneling events between $N_8$=0 (e.g., element 905) and $N_8$=1 (e.g., element 910) are seen as two level switching in the measured current. A histogram of the full time trace is shown in the graph of FIG. 9B. The two well-resolved peaks correspond to the two charge states. Each peak can be nicely fit to a Gaussian with width $\sigma_I$=0.112 nA, corresponding to the current noise in the exemplary measurement setup. The centroids of the two Gaussians can be separated by $\Delta I$=0.772 nA, which can correspond to the signal associated with a change in electron occupancy of one. For these data, a SNR=$\Delta I/\sigma_I$=6.9 can be extracted. By adjusting the FIR filter cutoff frequency, $f$, the SNR can be plotted as a function of the effective measurement bandwidth in the graph shown in FIG. 9C, which illustrates that the SNR decreases with increasing $f$.

A quantitative description of the SNR can benefit from a more careful analysis of the experimental setup. Thus, the current noise of the exemplary device can be measured. The measured noise spectra, $i_n(f)$, at current levels of about 4 nA (e.g., about 6 nA) are plotted as the traces 915 and 920 in the inset of the graph illustrated in FIG. 9C. The noise can be approximately white at high frequencies, but noise with an approximate 1/$f$ dependence can dominate at low frequency, and the overall noise level appears to be correlated to the derivative of the charge sensor current with respect to gate voltage. These spectra can be used to calculate the expected noise for a one second time series by integrating over frequency from 1 Hz to the filter cutoff frequency, $f$, which can produce, for example:

$$\sigma_I^2(f) = \int_{1Hz}^{f} i_n^2(f') df'. \quad (1)$$

Using the measured signal $\Delta I$=0.772 nA, the expected SNR can be plotted as a function of $f$ in the graph shown in FIG. 9C. The measured SNR falls within the shaded region 925 between the two curves 930 and 935, which delineate the expected SNR for current levels of 4 and 6 nA. For a 30 kHz bandwidth the SNR=7, implying an effective charge sensitivity of $8.2 \times 10^{-4}$ e/$\sqrt{Hz}$. This sensitivity can be favorable to both the rf-QPC (~$10^{-3}$ e/$\sqrt{Hz}$) (see, e.g., Reference 32) and dispersive gate readout ($6.3 \times 10^{-3}$ e/$\sqrt{Hz}$) (see, e.g., Reference 33), however the exemplary measurement bandwidth can be limited to about 30 kHz due to the exemplary current amplifier. Improvements in both the sensitivity and measurement bandwidth can be facilitated by using a low temperature preamplifier (see, e.g., Reference 34) and a higher bandwidth room temperature amplifier.

Exemplary Versatility

The exemplary 9 dot linear array can be capable of hosting a diverse range of quantum dot qubits. Using individual spins, nine nearest-neighbor exchange-coupled Loss-DiVincenzo qubits can be formed within the exemplary array. (See, e.g., Reference 10). With the gate voltages configured differently, four singlet-triplet qubits can be formed using pairs of electrons (see, e.g., Reference 2) and the qubits can be coupled via a dipole-dipole interaction. Additionally, three exchange-only spin qubits can be defined, facilitating full electrical control over the Bloch sphere of each qubit. (See, e.g., References 26, 35 and 36). To demonstrate the versatility of this exemplary device architecture, a single-shot readout of an electron spin can be shown. Two capacitively-coupled DQD charge qubits can be formed, and an interaction strength of about 200 μeV can be measured, which can provide an about 50 GHz two-qubit gate operation speed.

Figure 10A:
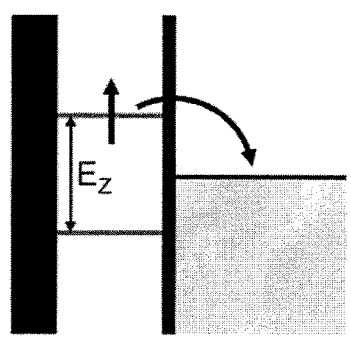
FIG. 10A is an exemplary diagram illustrating a single electron spin that is measured by aligning the spin states relative to the Fermi level of a source electrode, according to an exemplary embodiment of the present disclosure.

A single shot spin state readout on dot 8 in the linear array can be shown. A three-step pulse sequence can be employed to measure the spin relaxation time $T_1$ at a magnetic field B=1T. (See, e.g., References 23 and 24). Starting with an empty dot, the chemical potential of the dot level can be plunged below the Fermi level of the lead, which can facilitate an electron to load into either the spin up or the spin down state. After a time $t_{wait}$, the readout phase can begin by setting the chemical potential of the dot such that the spin up and spin down energy levels can straddle the Fermi level of the lead. If the electron on the dot can be in the spin-up excited state, as shown in the diagram of FIG. 10A, the electron can hop off of the dot and be replaced by a spin-down electron. The change in the charge occupancy of the quantum dot due to this process can be visible in time series measurements of the sensor dot current, I, and can be referred to as a "spin bump." In contrast, if the final spin state can be spin down, no spin bump may be observed. Then, the chemical potential of both spin states can be raised above the Fermi level to empty the dot and complete the measurement cycle.

Figure 10B:
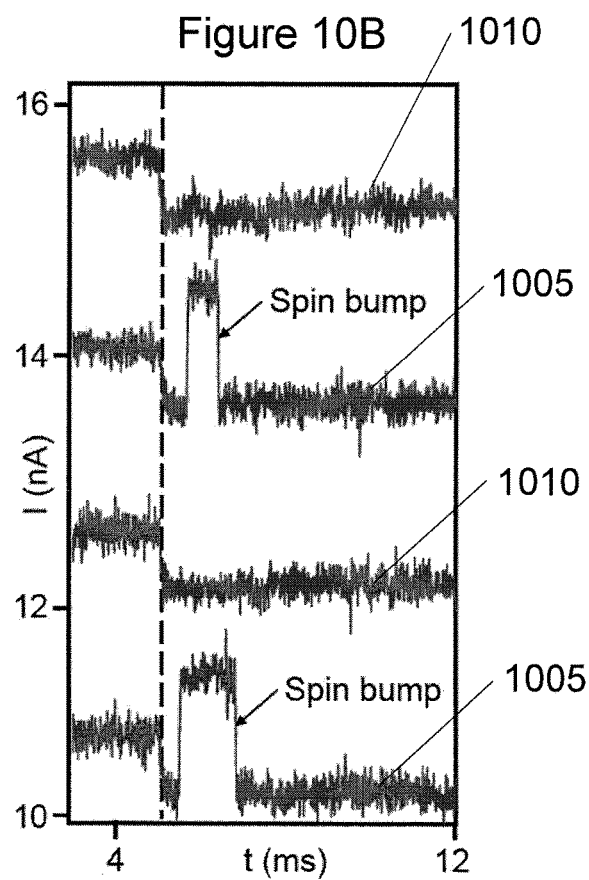
FIG. 10B is an exemplary graph of single shot traces, according to an exemplary embodiment of the present disclosure.
Figure 10C:
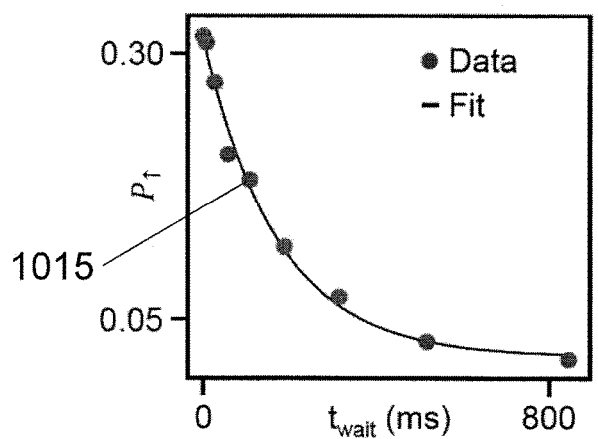
FIG. 10C is an exemplary graph illustrating how the spin up probability $P_1$ decays exponentially with $t_{wait}$, according to an exemplary embodiment of the present disclosure.

Exemplary single shot traces are shown in the graph of FIG. 10B. Spin up electrons are indicated in FIG. 10B by current pulses during the readout phase (e.g., traces 1005), while spin down electrons simply remain on the dot during the readout phase (e.g., traces 1010). $T_1$ can be extracted by varying $t_{wait}$ and measuring the probability $P_\uparrow$ of being in the spin up state at the end of the measurement phase. (See, e.g., graph of FIG. 10C). Each data point 1015 can represent the average of 10,000 single shot traces. The resulting data can be fit to an exponential decay with a best fit $T_1$=170±17 ms. The long spin relaxation time can be a defining factor of the Si "semiconductor vacuum."

Capacitive coupling has been proposed to mediate two qubit interactions. (See, e.g., Reference 12). The exemplary compact gate design can lead to large capacitive couplings. For example, the capacitive coupling of two adjacent DQDs was investigated. Dots 6-7 can be used to define one DQD, and dots 8-9 to define a second DQD. The charge stability diagrams for these DQDs are shown in the graphs of FIGS. 11A and 11B. The barrier gate voltage VB8 can be set such that there may be no tunneling between dots 7 and 8. As a result, the two DQDs can optionally be coupled only via a capacitive interaction $C_m$. Interdot detuning axes, $\varepsilon_L$ and $\varepsilon_R$, are overlaid on the data in the graphs of FIGS. 11A and 11B. By sweeping $\varepsilon_L$ vs $\varepsilon_R$, the quadruple quantum dot stability diagram shown in FIG. 11C can be obtained. The mutual capacitance $C_m$ causes the ($N_6$, $N_7$)=(1,0) to (0,1) interdot charge transition can shift by $\Delta\varepsilon_L$=0.77 when the occupancy of the second DQD can change from ($N_8$, $N_9$)=(1,0) to (0,1). Using the lever-arm conversion between gate voltage and energy, this can correspond to an about 200 μeV energy shift (e.g., about 50 GHz two-qubit gate operation time). (See, e.g., Reference 37).

The exemplary device according to an exemplary embodiment of the present disclosure can be a scalable quantum dot gate architecture that can yield quantum dots with uniform and reproducible characteristics. An exemplary 12 quantum dot device can include a linear array of nine quantum dots and three single quantum dot charge sensors can be provided. From characterization measurements, standard deviations in the charging energies and orbital energies of less than about 20% relative to their means: $E_c$=6.9±0.7 meV, $\varepsilon_{orb}$=3.0±0.5 meV can be obtained.

The exemplary device can detect real-time tunneling events in this large array, and use this capability for single shot measurements of the electron spin. The dipole-dipole coupling of two adjacent DQDs formed in the array can be characterized, and an interaction energy of 200 μeV, can be measured, which bodes well for computing architectures that rely on capacitive coupling of qubits.

According to certain exemplary embodiments of the present disclosure, for example, a quantum dot device can be provided, which can include a first aluminum layer configured to operate as a screening layer, a second aluminum layer, associated with the first aluminum layer, and configured to accumulate electrons in the a two-dimensional electron gas, and a third aluminum layer configured to tune a barrier(s) between regions of a two-dimensional electron gas accumulated by the second aluminum layer. The first, second and third aluminum layers can be fabricated or provided on an undoped silicon/silicon-germanium (Si/SiGe) substrate. Each of the first, second and third aluminum layers can have thereon a thin oxide layer. The thin oxide layer can be formed by exposing the first, second and third aluminum layers to an oxygen/argon mixture in a vacuum after metallization, and the thin oxide layer can electrically isolate one of the first, second and third aluminum layers from another of the first second and third aluminum layers.

In some exemplary embodiments of the present disclosure, the first aluminum layer can include a single-dimensional channel that can have an array of quantum dots. The first aluminum layer can include a plurality of transport channels adjacent to the single-dimensional channel, where each of the transport channels can include a single charge sensing quantum dot. The second aluminum layer can include a plurality of gates disposed thereon. The gates can be held at a relatively positive voltage, and the gates can accumulate electrons through a plurality of openings in the first aluminum layer.

A further exemplary embodiment of the present disclosure can include, for example, a method for fabricating a quantum dot device, which can include, forming a first aluminum layer, where the first aluminum layer can be configured to operate as a screening layer, forming a second aluminum layer adjacent to the first aluminum layer, where the second aluminum layer can be configured to accumulate electrons, and forming a third aluminum layer adjacent to the second layer, where the third aluminum layer can be configured to tune a barrier(s) between regions of a two-dimensional electron gas (2DEG) accumulated by the second aluminum layer. The first, second and/or third aluminum layers can each be formed on an undoped silicon/silicon-germanium (Si/SiGe) substrate. A thin oxide layer can be formed on each of the first, second and third aluminum layers, which can be formed by exposing the first, second and third aluminum layers to an oxygen/argon mixture in a vacuum after metallization.

In certain exemplary embodiments of the present disclosure, a single-dimensional channel that has an array of quantum dots can be formed or otherwise provided on the first aluminum layer. A plurality of transport channels can be formed on the first aluminum layer, adjacent to the single-dimensional channel, where each of the transport channels can include a plurality of charge sensing quantum dots. A plurality of gates can be formed or otherwise provided on the second aluminum layer, where the gates can be held at a relatively positive voltage. The gates can accumulate electrons through a plurality of openings in the first aluminum layer. The second aluminum layer can be formed on top of the first aluminum layer, and the third aluminum layer can be formed on top of the second aluminum layer.

Figure 12:
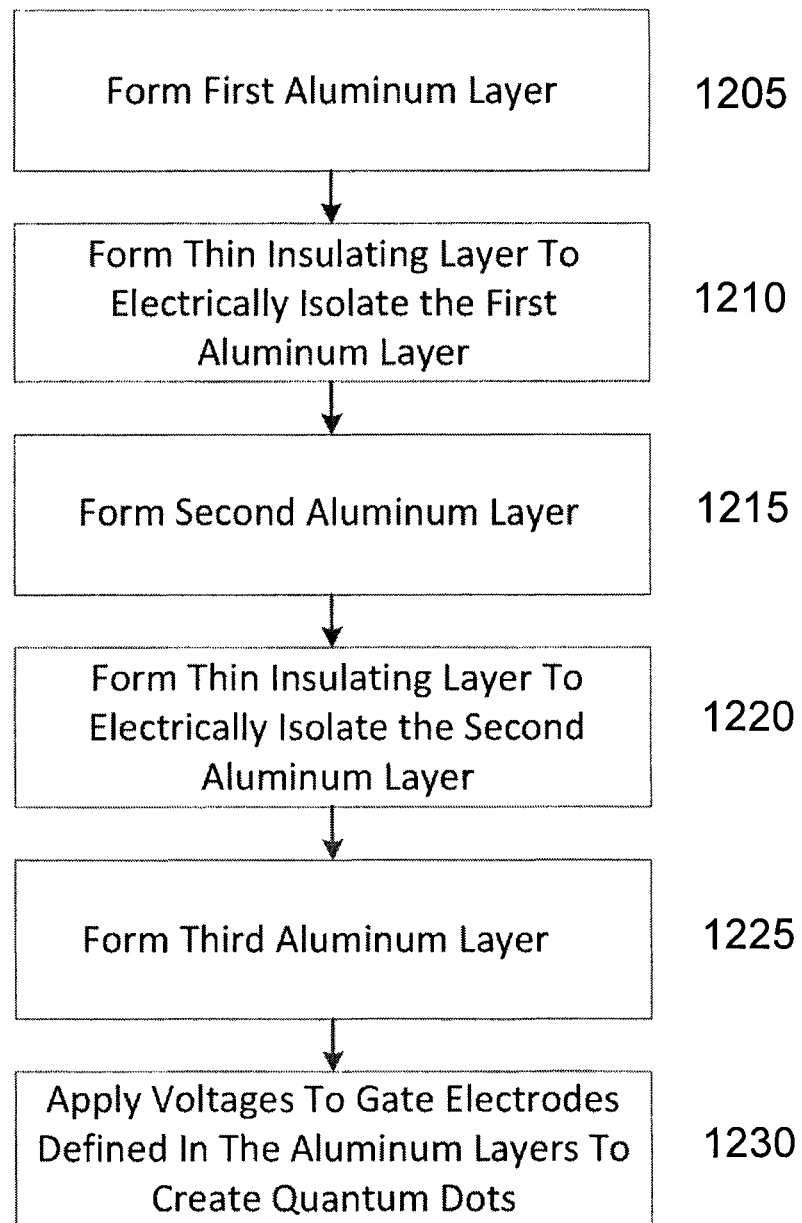
FIG. 12 is an exemplary method for fabricating a quantum dot device, according to an exemplary embodiment of the present disclosure.

FIG. 12 shows an exemplary method 1200 for fabricating a quantum dot device, according to an exemplary embodiment of the present disclosure. For example, at procedure 1205, a first conductive layer, e.g. aluminum, can be formed. In some exemplary embodiments of the device this can be done using electron-beam lithography, photolithography, and/or metal evaporation. At procedure 1210, an insulating layer can be formed in order to electrically isolate the first conductive layer. At procedure 1215, a second conductive layer can be formed, and at procedure 1220 a second insulating layer can be formed in order to electrically isolate the second conductive layer. Procedure 1215 and 1220 can be executed using a similar processes and conductive materials, e.g. aluminum, as procedures 1205 and 1220 or by using different materials and processes. At procedure 1225 a third conductive layer can be formed on top, or adjacent to the first two layers. These conductive and insulating layers, and any gate structures within them can be used to create quantum dots by applying different or similar voltages to them 1230.

Figure 13:
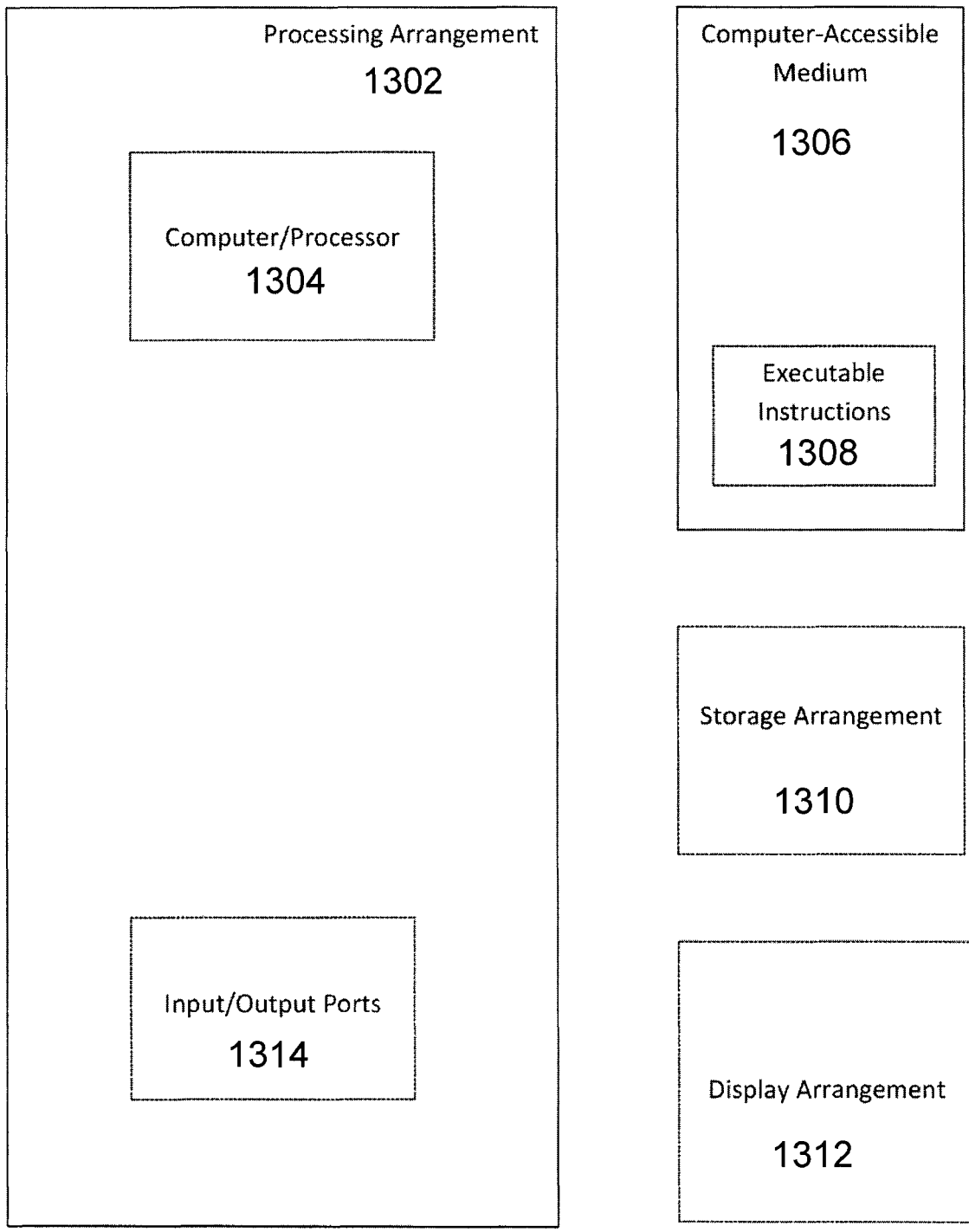
FIG. 13 is an illustration of an exemplary block diagram of an exemplary system in accordance with certain exemplary embodiments of the present disclosure.

FIG. 13 shows a block diagram of an exemplary embodiment of a system according to the present disclosure. For example, exemplary procedures in accordance with the present disclosure described herein can be performed by a processing arrangement and/or a computing arrangement 1302. Such processing/computing arrangement 1302 can be, for example entirely or a part of, or include, but not limited to, a computer/processor 1304 that can include, for example one or more microprocessors, and use instructions stored on a computer-accessible medium (e.g., RAM, ROM, hard drive, or other storage device).

As shown in FIG. 13, for example a computer-accessible medium 1306 (e.g., as described herein above, a storage device such as a hard disk, floppy disk, memory stick, CD-ROM, RAM, ROM, etc., or a collection thereof) can be provided (e.g., in communication with the processing arrangement 1302). The computer-accessible medium 1306 can contain executable instructions 1308 thereon. In addition or alternatively, a storage arrangement 1310 can be provided separately from the computer-accessible medium 1306, which can provide the instructions to the processing arrangement 1302 so as to configure the processing arrangement to execute certain exemplary procedures, processes and methods, as described herein above, for example.

Further, the exemplary processing arrangement 1302 can be provided with or include an input/output arrangement 1314, which can include, for example a wired network, a wireless network, the internet, an intranet, a data collection probe, a sensor, etc. As shown in FIG. 13, the exemplary processing arrangement 1302 can be in communication with an exemplary display arrangement 1312, which, according to certain exemplary embodiments of the present disclosure, can be a touch-screen configured for inputting information to the processing arrangement in addition to outputting information from the processing arrangement, for example. Further, the exemplary display 1312 and/or a storage arrangement 1310 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification, drawings and claims thereof, can be used synonymously in certain instances, including, but not limited to, for example, data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

EXEMPLARY REFERENCES

The following references are hereby incorporated by reference in their entireties:

[1] M. Ciorga, M. Pioro-Ladriere, P. Zawadzki, P. Hawrylak, and A. S. Sachrajda, Appl. Phys. Lett. 80, 2177 (2002).
[2] J. R. Petta, A. C. Johnson, J. M. Taylor, E. A. Laird, A. Yacoby, M. D. Lukin, C. M. Marcus, M. P. Hanson, and A. C. Gossard, Science 309, 2180 (2005).
[3] M. Stopa and C. M. Marcus, Nano Lett. 8, 1778 (2008).
[4] E. A. Laird, J. M. Taylor, D. P. DiVincenzo, C. M. Marcus, M. P. Hanson, and A. C. Gossard, Phys. Rev. B 82, 075403 (2010).
[5] G. E. Moore, Cramming more components onto integrated circuits, Electronics 38, 8 (1965).
[6] P. W. Shor, Polynomial-time algorithms for prime factorization and discrete logarithms on a quantum computer, SIAM Review 41, 303 (1999).
[7] L. K. Grover, in Proceedings of the 28th Annual ACM Symposium on Theory of Computing (ACM, 1996) pp. 212-219.
[8] L. P. Kouwenhoven, C. M. Marcus, P. L. McEuen, S. Tarucha, R. M. Westervelt, and N. S. Wingreen, Mesoscopic electron transport (Springer, 1997).
[9] R. Hanson, L. P. Kouwenhoven, J. R. Petta, S. Tarucha, and L. M. K. Vandersypen, Spins in few-electron quantum dots, Rev. Mod. Phys. 79, 1217 (2007).
[10] D. Loss and D. P. DiVincenzo, Quantum computation with quantum dots, Phys. Rev. A 57, 120 (1998).
[11] D. P. DiVincenzo, D. Bacon, J. Kempe, G. Burkard, and K. B. Whaley, Universal quantum computation with the exchange interaction, Nature (London) 408, 339 (2000).
[12] J. M. Taylor, H.-A. Engel, W. Dür, A. Yacoby, C. M. Marcus, P. Zoller, and M. D. Lukin, Fault-tolerant architecture for quantum computation using electrically controlled semiconductor spins, Nat. Phys. 1, 177 (2005).
[13] M. Steger, K. Saeedi, M. L. W. Thewalt, J. J. L. Morton, H. Riemann, N. V. Abrosimov, P. Becker, and H.-J. Pohl, Quantum Information Storage for Over 180 s Using Donor Spins in a 28Si "Semiconductor Vacuum," Science 336, 1280 (2012).
[14] A. M. Tyryshkin, S. Tojo, J. J. L. Morton, H. Riemann, N. V. Abrosimov, P. Becker, H.-J. Pohl, T. Schenkel, M. L. W. Thewalt, K. M. Itoh, et al., Electron spin coherence exceeding seconds in high-purity silicon, Nat. Mater. 11, 143 (2012).
[15] C. Payette, K. Wang, P. J. Koppinen, Y. Dovzhenko, J. C. Sturm, and J. R. Petta, Single charge sensing and transport in double quantum dots fabricated from commercially grown Si/SiGe heterostructures, Appl. Phys. Lett. 100, 043508 (2012).
[16] D. M. Zajac, T. M. Hazard, X. Mi, K. Wang, and J. R. Petta, A reconfigurable gate architecture for Si/SiGe quantum dots, Appl. Phys. Lett. 106, 223507 (2015).
[17] X. Mi, T. M. Hazard, C. Payette, K. Wang, D. M. Zajac, J. V. Cady, and J. R. Petta, Magnetotransport studies of mobility limiting mechanisms in undoped Si/SiGe heterostructures, Phys. Rev. B 92, 035304 (2015).
[18] C. H. Yang, A. Rossi, R. Ruskov, N. S. Lai, F. A. Mohiyaddin, S. Lee, C. Tahan, G. Klimeck, A. Morello, and A. S. Dzurak, Spin-valley lifetimes in a silicon quantum dot with tunable valley splitting, Nat. Commun. 4, 2069 (2013).
[19] M. G. Borselli, R. S. Ross, A. A. Kiselev, E. T. Croke, K. S. Holabird, P. W. Deelman, L. D. Warren, I. Alvarado-Rodriguez, I. Milosavljevic, F. C. Ku, et al., Measurement of valley splitting in high-symmetry Si/SiGe quantum dots, Appl. Phys. Lett. 98, 123118 (2011).
[20] J. M. Elzerman, R. Hanson, L. H. W. Van Beveren, L. M. K. Vandersypen, and L. P. Kouwenhoven, Excited-state spectroscopy on a nearly closed quantum dot via charge detection, Appl. Phys. Lett. 84, 4617 (2004).
[21] C. H. Yang, W. H. Lim, N. S. Lai, A. Rossi, A. Morello, and A. S. Dzurak, Orbital and valley state spectra of a few-electron silicon quantum dot, Phys. Rev. B 86, 115319 (2012).
[22] M. Yuan, F. Pan, Z. Yang, T. J. Gilheart, F. Chen, D. E. Savage, M. G. Lagally, M. A. Eriksson, and A. J. Rimberg, Si/SiGe quantum dot with superconducting single-electron transistor charge sensor, Appl. Phys. Lett. 98, 142104 (2011).
[23] J. M. Elzerman, R. Hanson, L. H. W. Van Beveren, B. Witkamp, L. M. K. Vandersypen, and L. P. Kouwenhoven, Single-shot read-out of an individual electron spin in a quantum dot, Nature (London) 430, 431 (2004).
[24] A. Morello, J. J. Pla, F. A. Zwanenburg, K. W. Chan, K. Y. Tan, H. Huebl, M. Möttönen, C. D. Nugroho, C. Yang, J. A. van Donkelaar, et al., Single-shot readout of an electron spin in silicon, Nature (London) 467, 687 (2010).
[25] J. Medford, J. Beil, J. M. Taylor, E. I. Rashba, H. Lu, A. C. Gossard, and C. M. Marcus, Quantum-dot-based resonant exchange qubit, Phys. Rev. Lett. 111, 050501 (2013).
[26] FastCap (http://www.fastfieldsolvers.com/).
[27] W. G. Van der Wiel, S. De Franceschi, J. M. Elzerman, T. Fujisawa, S. Tarucha, and L. P. Kouwenhoven, Electron transport through double quantum dots, Rev. Mod. Phys. 75, 1 (2002).
[28] B. Küng, C. Rössler, M. Beck, M. Marthaler, D. S. Golubev, Y. Utsumi, T. Ihn, and K. Ensslin, Irreversibility on the level of single-electron tunneling, Phys. Rev. X 2, 011001 (2012).
[29] V. F. Maisi, A. Hofmann, M. Röösli, J. Basset, C. Reichl, W. Wegscheider, T. Ihn, and K. Ensslin, Spin- Orbit Coupling at the Level of a Single Electron, Phys. Rev. Lett. 116, 136803 (2016).

[30] L. M. K. Vandersypen, J. M. Elzerman, R. N. Schouten, L. H. W. Van Beveren, R. Hanson, and L. P. Kouwenhoven, Real-time detection of single-electron tunneling using a quantum point contact, Appl. Phys. Lett. 85, 4394 (2004).

[31] S. Gustavsson, R. Leturcq, M. Studer, I. Shorubalko, T. Ihn, K. Ensslin, D. C. Driscoll, and A. C. Gossard, Electron counting in quantum dots, Surf. Sci. Rep. 64, 191 (2009).

[32] D. J. Reilly, C. M. Marcus, M. P. Hanson, and A. C. Gossard, Fast single-charge sensing with a rf quantum point contact, Appl. Phys. Lett. 91, 162101 (2007).

[33] J. I. Colless, A. C. Mahoney, J. M. Hornibrook, A. C. Doherty, H. Lu, A. C. Gossard, and D. J. Reilly, Dispersive readout of a few-electron double quantum dot with fast rf gate sensors, Phys. Rev. Lett. 110, 046805 (2013).

[34] M. J. Curry, T. D. England, N. C. Bishop, G. Ten-Eyck, J. R. Wendt, T. Pluym, M. P. Lilly, S. M. Carr, and M. S. Carroll, Cryogenic preamplification of a single-electron-transistor using a silicon-germanium heterojunction-bipolar-transistor, Appl. Phys. Lett. 106, 203505 (2015).

[35] J. Medford, J. Beil, J. M. Taylor, S. D. Bartlett, A. C. Doherty, E. I. Rashba, D. P. DiVincenzo, H. Lu, A. C. Gossard, and C. M. Marcus, Self-consistent measurement and state tomography of an exchange-only spin qubit, Nat. Nanotechnol. 8, 654 (2013).

[36] K. Eng, T. D. Ladd, A. Smith, M. G. Borselli, A. A. Kiselev, B. H. Fong, K. S. Holabird, T. M. Hazard, B. Huang, P. W. Deelman, et al., Isotopically enhanced triple-quantum-dot qubit, Science Advances 1, e1500214 (2015).

[37] D. R. Ward, D. Kim, D. E. Savage, M. G. Lagally, R. H. Foote, M. Friesen, S. N. Coppersmith, and M. A. Eriksson, State-conditional coherent charge qubit oscillations in a Si/SiGe quadruple quantum dot, arXiv:1604.07956.

What is claimed:

1. A quantum dot device, comprising:
a repeating quantum dot cell structure having repeated cells, wherein each of the repeated cells comprises one or more quantum dots and is electrically connected to another one of the repeated cells which is adjacent thereto, wherein one or more of the repeated cells comprises one or more gates configured to apply a voltage pulse to cause an electron to move from a quantum dot to an adjacent quantum dot of the one or more quantum dots.

2. The quantum dot device of claim 1, wherein electrically-connected quantum dots of at least one of the repeated cells are provided in a nearest neighbor configuration.

3. The quantum dot device of claim 1, wherein at least one of the repeated cells includes at least two quantum dots.

4. The quantum dot device of claim 1, wherein one or more of the repeated cells includes at least three conductive layers and at least two insulating layers electrically insulating the at least three conductive layers from one another.

5. The quantum dot device of claim 4, wherein the at least three conductive layers comprise:
a first conductive layer configured to operate as a screening layer;
a second conductive layer configured to cause accumulation of electrons in a two-dimensional electron gas (2DEG); and
a third conductive layer configured to tune at least one barrier between regions of the 2DEG.

6. The quantum dot device of claim 5, wherein a first one of the at least two insulating layers electrically insulates the first conductive layer from one or more of the second conductive layer or the third conductive layer, and a second one of the at least two insulating layers electrically insulates the second conductive layer from the third conductive layer.

7. The quantum dot device of claim 5, wherein the first conductive layer comprises a first channel configured for forming a plurality of quantum dots and a second channel configured for forming a sensor quantum dot for reading states of the plurality of quantum dots.

8. The quantum dot device of claim 7, wherein the second conductive layer comprises a first plurality of gates configured to control a number of electrons in corresponding quantum dots of the plurality of quantum dots.

9. The quantum dot device of claim 8, wherein the third conductive layer comprises a second plurality of gates configured to control tunnel coupling between corresponding adjacent quantum dots of the plurality of quantum dots.

10. The quantum dot device of claim 5, wherein the at least three conductive layers comprise one or more of aluminum, gold, copper, or polysilicon.

11. The quantum dot device of claim 5, wherein the at least two insulating layers comprise one or more of silicon oxide, silicon nitride, or aluminum oxide.

12. The quantum dot device of claim 1, wherein a charge state of each of the repeated cells is one or more of (i) measurable, (ii) readout using a quantum point contact, (iii) readout using a charge sensor quantum dot, or (iv) readout through the use of a radio frequency measurement.

13. The quantum dot device of claim 1, wherein adjacent cells of the repeated cells are configured to allow single electrons to be shuttled through quantum dots from one adjacent cell to the other of the adjacent cells using voltage pulses.

14. The quantum dot device of claim 1, wherein each of the repeated cells comprises a charge sensor configured to measure a charge of at least two corresponding quantum dot cells of a repeated cell.

15. The quantum dot device of claim 1, wherein each of the repeated cells comprises three quantum dots and a charge sensor configured to determine a state of each of the three quantum dots.

16. The quantum dot device of claim 1, wherein the repeated cells are disposed as a linear array of quantum dot cells.

17. The quantum dot device of claim 16, wherein the linear array comprises at least about 10 quantum dot cells.

18. The quantum dot device of claim 16, wherein the linear array comprises at least about 100 quantum dot cells.

19. The quantum dot device of claim 1, wherein the repeated cells are configured to cause an electron to move along an array of repeated cells to move information through a quantum computer.

20. The quantum dot device of claim 1, wherein the one or more quantum dots comprise at least one of: a gate-defined quantum dot or a gate pattern comprising the one or more gates and configured to form corresponding quantum potentials based on voltages applied to the gate pattern.

21. The quantum dot device of claim 1, wherein the one or more gates are configured to apply a voltage to adjust a tunnel coupling between adjacent dots.

22. A quantum dot device, comprising:
a repeating quantum dot cell structure having repeated cells, wherein each of the repeated cells comprises one or more quantum dots and is electrically connected to another one of the repeated cells which is adjacent thereto, and wherein each of the repeated cells comprises three quantum dots and a charge sensor configured to determine a state of each of the three quantum dots.

23. The quantum dot device of claim 22, wherein one or more of the repeated cells includes at least three conductive layers and at least two insulating layers electrically insulating the at least three conductive layers from one another.

24. The quantum dot device of claim 23, wherein the at least three conductive layers comprise:
a first conductive layer configured to operate as a screening layer;
a second conductive layer configured to cause accumulation of electrons in a two-dimensional electron gas (2DEG); and
a third conductive layer configured to tune at least one barrier between regions of the 2DEG.

25. The quantum dot device of claim 22, wherein the repeated cells are disposed as a linear array of quantum dot cells.

26. The quantum dot device of claim 22, wherein the repeated cells are configured to cause an electron to move along an array of repeated cells to move information through a quantum computer.

27. The quantum dot device of claim 22, wherein the one or more quantum dots comprise at least one of: a gate-defined quantum dot or a gate pattern comprising the one or more gates and configured to form corresponding quantum potentials based on voltages applied to the gate pattern.

28. A quantum dot device, comprising:
a repeating quantum dot cell structure having repeated cells, wherein each of the repeated cells comprises one or more quantum dots and is electrically connected to another one of the repeated cells which is adjacent thereto, and
wherein one or more of the repeated cells includes at least three conductive layers and at least two insulating layers electrically insulating the at least three conductive layers from one another.

29. The quantum dot device of claim 28, wherein a first conducting layer of the at least three conductive layers is configured to control a number of electrons in each of the one or more quantum dots.

30. The quantum dot device of claim 28, wherein a second conducting layer of the at least three conductive layers is configured to adjust a tunnel coupling of adjacent quantum dots of the one or more quantum dots.

31. The quantum dot device of claim 28, wherein the repeated cells are disposed as a linear array of quantum dot cells.

32. The quantum dot device of claim 28, wherein the repeated cells are configured to cause an electron to move along an array of repeated cells to move information through a quantum computer.

33. The quantum dot device of claim 28, wherein the one or more quantum dots comprise at least one of: a gate-defined quantum dot or a gate pattern comprising the one or more gates and configured to form corresponding quantum potentials based on voltages applied to the gate pattern.

* * * * *

UNITED STATES PATENT AND TRADEMARK OFFICE
CERTIFICATE OF CORRECTION

PATENT NO. : 10,978,578 B2
APPLICATION NO. : 16/222529
DATED : April 13, 2021
INVENTOR(S) : Petta et al.

Page 1 of 1

It is certified that error appears in the above-identified patent and that said Letters Patent is hereby corrected as shown below:

In the Specification

At Column 1, Line 18, delete "W911NF-15-0149" and substitute therefor -- W911NF-15-1-0149 --

Signed and Sealed this
Sixth Day of July, 2021

Drew Hirshfeld
*Performing the Functions and Duties of the
Under Secretary of Commerce for Intellectual Property and
Director of the United States Patent and Trademark Office*